US009484935B2

(12) United States Patent
Shanan et al.

(10) Patent No.: US 9,484,935 B2
(45) Date of Patent: Nov. 1, 2016

(54) APPARATUS AND METHODS FOR FREQUENCY LOCK ENHANCEMENT OF PHASE-LOCKED LOOPS

(71) Applicant: ANALOG DEVICES GLOBAL, Hamilton (BM)

(72) Inventors: Hyman Shanan, Franklin Park, NJ (US); Michael F. Keaveney, Lisnagry (IE)

(73) Assignee: Analog Devices Global, Hamilton (BM)

( * ) Notice: Subject to any disclaimer, the term of this patent is extended or adjusted under 35 U.S.C. 154(b) by 118 days.

(21) Appl. No.: 14/134,767

(22) Filed: Dec. 19, 2013

(65) Prior Publication Data

US 2015/0180485 A1   Jun. 25, 2015

(51) Int. Cl.
| | |
|---|---|
| H03L 7/06 | (2006.01) |
| H03L 7/099 | (2006.01) |
| H03L 1/02 | (2006.01) |
| H03L 7/10 | (2006.01) |

(52) U.S. Cl.
CPC ............. H03L 7/099 (2013.01); H03L 1/026 (2013.01); H03L 7/104 (2013.01)

(58) Field of Classification Search
CPC ...................................................... H03L 7/099
See application file for complete search history.

(56) References Cited

U.S. PATENT DOCUMENTS

| | | | |
|---|---|---|---|
| 6,342,798 B1 | 1/2002 | Yoshida | |
| 7,463,097 B2 | 12/2008 | Costa et al. | |
| 7,519,140 B2 * | 4/2009 | Yoshimura | 375/376 |
| 7,834,705 B2 * | 11/2010 | Seo et al. | 331/2 |
| 7,940,129 B1 * | 5/2011 | Tsang et al. | 331/17 |
| 8,085,098 B2 * | 12/2011 | Yamazaki | 331/10 |
| 8,134,417 B2 * | 3/2012 | Chiang et al. | 331/109 |
| 8,410,835 B1 * | 4/2013 | Sorna et al. | 327/157 |
| 8,421,542 B2 * | 4/2013 | Romano et al. | 331/17 |
| 8,508,308 B2 * | 8/2013 | Dong et al. | 331/179 |
| 8,981,855 B2 * | 3/2015 | Romano et al. | 331/17 |
| 2002/0036545 A1 | 3/2002 | Fridi et al. | |
| 2003/0151396 A1 | 8/2003 | Self et al. | |
| 2003/0222722 A1 * | 12/2003 | Kwon | 331/17 |
| 2005/0174185 A1 * | 8/2005 | Steinbach et al. | 331/179 |
| 2005/0175136 A1 * | 8/2005 | Wu | 375/376 |
| 2005/0179501 A1 * | 8/2005 | Natonio et al. | 331/16 |
| 2005/0264330 A1 * | 12/2005 | Li | 327/156 |
| 2006/0226916 A1 * | 10/2006 | Florescu et al. | 331/16 |
| 2009/0066425 A1 * | 3/2009 | Seo et al. | 331/34 |
| 2009/0134947 A1 | 5/2009 | Tarng | |
| 2010/0225407 A1 | 9/2010 | Goyal et al. | |

(Continued)

FOREIGN PATENT DOCUMENTS

| | | |
|---|---|---|
| EP | 1189351 A2 | 3/2002 |
| WO | WO 2007/055870 A2 | 5/2007 |

*Primary Examiner* — Ryan Jager
(74) *Attorney, Agent, or Firm* — Knobbe Martens Olson & Bear LLP

(57) ABSTRACT

Apparatus and methods for frequency lock enhancement of phase-locked loops (PLLs) are provided. In one aspect, a PLL can include a VCO having a tuning voltage input and a frequency tuning circuit configured to set a frequency band setting of the VCO. The frequency tuning circuit can include a voltage monitor configured to compare the voltage level of the tuning voltage input to one or more tuning voltage threshold levels, a control circuit configured to control at least a frequency band setting and a bias current setting of the VCO, and an amplitude detection circuit configured to compare an amplitude of an oscillation signal of the VCO to one or more amplitude threshold levels.

18 Claims, 13 Drawing Sheets

(56) References Cited

U.S. PATENT DOCUMENTS

| | | |
|---|---|---|
| 2010/0308930 A1 | 12/2010 | Ayazi et al. |
| 2011/0050353 A1 | 3/2011 | Zhu |
| 2011/0260761 A1* | 10/2011 | Kearney et al. ............... 327/156 |
| 2011/0304407 A1* | 12/2011 | Chiang et al. ................ 331/182 |
| 2011/0316595 A1 | 12/2011 | Bolton |
| 2014/0218123 A1 | 8/2014 | Wei et al. |

* cited by examiner

APPARATUS AND METHODS FOR FREQUENCY LOCK ENHANCEMENT OF PHASE-LOCKED LOOPS

CROSS-REFERENCE TO RELATED APPLICATIONS

This application is related to U.S. application Ser. No. 14/134,782, entitled "APPARATUS AND METHODS FOR PHASE-LOCKED LOOPS WITH TEMPERATURE COMPENSATED CALIBRATION VOLTAGE" (Inventors: Hyman Shanan and Michael F. Keaveney; filed on even date herewith), the disclosure of which is incorporated herein by reference in its entirety.

BACKGROUND

1. Field

Embodiments of the invention relate to electronic systems, and more particularly, to frequency lock enhancement of phase-locked loops (PLLs).

2. Description of the Related Technology

Phase-locked loops (PLLs) can be used in a variety of applications for generating an output clock signal having a controlled phase and frequency relationship to a reference clock signal. PLLs can be used in, for example, telecommunications systems and/or chip-to-chip communication.

SUMMARY

In one aspect, an apparatus includes a phase-locked loop (PLL) having a calibration mode and an operational mode. The PLL includes a voltage controlled oscillator (VCO) having a tuning voltage input, and an oscillation frequency of the VCO changes in relation to a voltage level of the tuning voltage input. The PLL further includes a calibration voltage generation circuit configured to generate a calibration voltage. The tuning voltage input of the VCO is configured to receive the calibration voltage when the PLL is in the calibration mode. The calibration voltage generation circuit is configured to sense a temperature of the PLL, and to control a voltage level of the calibration voltage based on the sensed temperature. The calibration voltage generation circuit includes a bandgap reference circuit configured to generate a zero-to-absolute-temperature (ZTAT) current and a proportional-to-absolute temperature (PTAT) current, and the calibration voltage circuit generation circuit is configured to generate the calibration voltage based in part on a difference between the PTAT current and the ZTAT current.

In another aspect, an electronically implemented method of calibrating a PLL is provided. The method includes setting the PLL in a calibration mode, sensing a temperature of the PLL, generating a calibration voltage based on the sensed temperature, controlling a voltage level of a tuning voltage input of a VCO of the PLL using the calibration voltage, and selecting a frequency band setting of the VCO using a frequency tuning circuit. Generating the calibration voltage includes generating a ZTAT current and a PTAT current using a bandgap reference circuit, and generating the calibration voltage based in part on a difference between the ZTAT current and the PTAT current.

In another aspect, an apparatus includes a PLL having a calibration mode and an operational mode. The PLL includes a VCO having a tuning voltage input, and an oscillation frequency of the VCO changes in relation to a voltage level of the tuning voltage input. The PLL further includes a frequency tuning circuit configured to set a frequency band setting of the VCO. The frequency tuning circuit includes a voltage monitor and a control circuit. The control circuit is configured to set the frequency band setting of the VCO by selecting a coarse capacitance setting of the VCO, and the voltage monitor is configured to determine whether the voltage level of the tuning voltage input is within a tuning voltage range.

In another aspect, an electronically implemented method of calibrating a PLL is provided. The method includes setting the PLL in a calibration mode and selecting a frequency band setting of a VCO of the PLL using a frequency tuning circuit. Selecting the frequency band setting of the VCO includes setting a coarse capacitance setting of the VCO to a first setting during the calibration mode, locking the PLL with the coarse capacitance setting of the VCO set to the first setting, determining whether a voltage level of the tuning voltage input is within a tuning voltage range with the first setting when the PLL is locked, and adjusting the coarse capacitance setting of the VCO when the voltage level of the tuning voltage output is outside of the tuning voltage range.

In another aspect, a PLL is provided. The PLL includes a VCO having a tuning voltage input and a frequency tuning circuit configured to set a frequency band setting of the VCO. An oscillation frequency of the VCO changes in relation to the voltage level of the tuning voltage input, and the VCO is configured to generate an oscillation signal that oscillates at the oscillation frequency. The frequency tuning circuit includes a voltage monitor configured to compare the voltage level of the tuning voltage input to one or more tuning voltage threshold levels, a control circuit configured to control at least a frequency band setting and a bias current setting of the VCO, and an amplitude detection circuit configured to compare an amplitude of the oscillation signal to one or more amplitude threshold levels.

In another aspect, an electronically implemented method of maintaining lock in a PLL is provided. The method includes receiving a tuning voltage from a loop filter at a tuning voltage input of a VCO, determining whether a voltage level of the tuning voltage input is within a tuning voltage range, and adjusting an amount of bias current of the VCO when the voltage level of the tuning voltage input is outside of the tuning voltage range.

DETAILED DESCRIPTION OF EMBODIMENTS

Figure 1A:
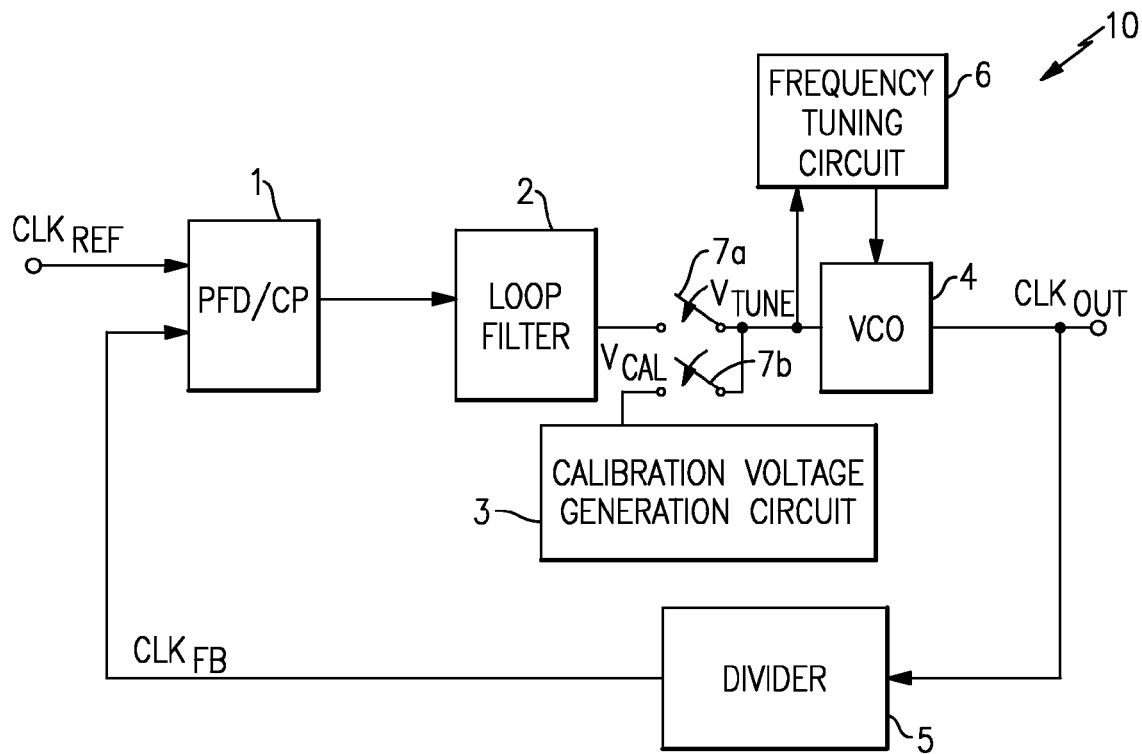
FIG. 1A is a schematic block diagram of one embodiment of a phase-locked loop (PLL).

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Apparatus and methods for frequency lock enhancement in PLLs are disclosed. One or more of the lock enhancement techniques disclosed herein can be used in a PLL, and can aid in maintaining frequency lock of the PLL over process, voltage, and/or temperature variations.

In a first aspect, an analog temperature-compensated voltage is used to set a VCO's tuning voltage while performing VCO frequency band calibration. For example, a PLL can include a VCO and a calibration voltage generation circuit that can generate a calibration voltage for controlling a tuning voltage input of the VCO when the VCO is being coarsely tuned. Additionally, the calibration voltage generation circuit can sense a temperature of the PLL, and can control a voltage level of the calibration voltage to provide compensation based on the sensed temperature. For example, the calibration voltage generation circuit can control a voltage level of the calibration voltage to maintain the tuning voltage within a tuning voltage range over temperature. Configuring the PLL in this manner can increase the linear range available for VCO tuning across temperature changes.

In a second aspect, a PLL includes a frequency tuning circuit for coarsely tuning the PLL's VCO. The frequency tuning circuit includes a tuning voltage monitor that can monitor a voltage of the VCO's tuning input. In certain implementations, after the VCO has been coarsely tuned, the tuning voltage monitor can determine whether or not the tuning voltage is within an acceptable tuning voltage range or window. When the tuning voltage monitor determines that the tuning voltage is outside of the acceptable tuning voltage range, the frequency tuning circuit can adjust a coarse variable capacitance of the VCO to bring the tuning voltage within the acceptable tuning voltage range. In certain implementations, the coarse variable capacitor can be digitally-controlled, and the frequency tuning circuit adjusts the coarse variable capacitance by incrementing or decrementing a coarse capacitance control signal as needed. By configuring the frequency tuning circuit in this manner, VCO frequency band calibration errors can be detected and corrected and/or the VCO's tuning voltage can operate relatively close to a mid-supply voltage, which can reduce the settling time of a PLL and/or increase the PLL's capture range.

In a third aspect, a frequency control gain or $K_{VCO}$ of a VCO is dynamically adjusted during operation of the PLL to maintain the PLL in lock. For example, the PLL can include a frequency tuning or VCO gain ($K_{VCO}$) control circuit including a tuning voltage monitor used to monitor the PLL's tuning voltage while the PLL is operating. When the frequency tuning circuit determines that the tuning voltage is outside an acceptable tuning voltage range, the frequency tuning circuit can adjust a bias current of the VCO to change the VCO's $K_{VCO}$ to bring the tuning voltage within the acceptable tuning voltage range. In certain implementations, the frequency tuning circuit further includes an amplitude detection circuit that can compare the VCO's output amplitude to one or more threshold voltages, such as a high amplitude threshold and a low amplitude threshold. Additionally, the frequency tuning circuit can stop adjusting the bias current when the amplitude detection circuit determines that the VCO's output amplitude exceeds the high amplitude threshold or falls below the low amplitude threshold, and thus is outside of an acceptable amplitude range. Configuring the PLL in this manner can aid in dynamically adjusting the tuning voltage over process, temperature and/or supply variation to avoid loss of lock, while preventing the frequency tuning circuit from controlling the bias current to a level in which the VCO's amplitude is too small to maintain oscillation and/or too large to meet overvoltage specifications.

In some embodiments, when the frequency tuning circuit is unable to bring the tuning voltage within the acceptable tuning voltage range by adjusting the VCO's bias current, the frequency tuning circuit can adjust a fine variable capacitor of the VCO to bring the tuning voltage within the range. For example, the VCO's fine variable capacitor can include one or more tunable and/or switchable capacitor segments that can be used to control the VCO's oscillation frequency, and the frequency tuning circuit can use a fine capacitor control signal to change a capacitance of and/or a number of active segments. The frequency tuning circuit can adjust the fine capacitor control signal to bring the tuning voltage within the acceptable tuning voltage range, thereby maintaining frequency lock of the PLL during temperature and/or supply variations.

One or more of the frequency enhancement schemes described above can be used to enhance the frequency lock of a PLL. The teachings herein can be used advantageously to provide frequency lock enhancement to a PLL over variations in temperature and/or other parameters, including, for example process variations and/or supply voltage variation. In certain implementations, the frequency lock enhancement schemes can have a relatively small impact on the PLL's power consumption and/or circuit layout area. Furthermore, in certain implementations, one or more of the frequency lock enhancement schemes can be included in a particular PLL with relatively minor modifications to the PLL's design.

Overview of VCOs Tuned using a Temperature-Compensated Tuning Voltage

FIG. 1A is a schematic block diagram of one embodiment of a phase-locked loop (PLL) 10. The PLL 10 includes a phase-frequency detector (PFD) and charge pump 1, a loop filter 2, a calibration voltage generation circuit 3, a voltage controlled oscillator (VCO) 4, a divider 5, a frequency tuning circuit 6, and first and second switches 7a, 7b.

The PFD and charge pump (CP) 1 includes a first input configured to receive a reference clock signal $CLK_{REF}$ and a second input configured to receive a feedback clock signal $CLK_{FB}$. The PFD and charge pump 1 further includes an output electrically connected to an input of the loop filter 2. The loop filter 2 includes an output electrically connected to a tuning voltage input of the VCO 4 through the first switch 7a. The VCO 4 further includes an output configured to generate an output clock signal $CLK_{OUT}$. The divider 5 includes an input configured to receive the output clock signal $CLK_{OUT}$ and an output configured to generate the feedback clock signal $CLK_{FB}$.

The reference clock signal $CLK_{REF}$ can be generated in any suitable manner. In one embodiment, the reference clock signal $CLK_{REF}$ is generated by a reference oscillator internal to an integrated circuit (IC) on which the PLL 10 is fabricated. However, other configurations are possible.

The PFD and charge pump 1 can include circuitry configured to generate an error signal based on a phase difference and/or frequency difference between the reference clock signal $CLK_{REF}$ and the feedback clock signal $CLK_{FB}$. Additionally, the PFD and charge pump 1 can include charge pump circuitry that can control a flow of current into or out of the input of the loop filter 2 based on the error signal.

The PFD and charge pump 1 can be implemented in any suitable configuration. For example, in one embodiment, the PFD and charge pump 1 includes a first or positive current source operable to source current and a second or negative current source operable to sink current. The PFD and charge pump 1 can further include circuitry such as flip-flops and/or logic gates configured to generate control signals for controlling the positive and negative current sources. Although one example implementation of the PFD and charge pump 1 has been described, the PFD and charge pump 1 can be implemented using a variety of configurations.

The loop filter 2 can be any suitable PLL loop filter, including for example, an active loop filter or a passive loop filter. The loop filter 2 can be used for a variety of purposes, such as to maintain the stability of the PLL 10.

The VCO 4 can be implemented using a variety of oscillator configurations, including, for example, an inductor-capacitor (LC) tank oscillator implementation. However, other configurations are possible.

The frequency tuning circuit 6 can be used to control a coarse tuning frequency of the VCO 4 to select a correct frequency band that includes the target frequency to which the VCO 4 is to be tuned. For example, in one embodiment, the VCO 4 can include a coarse variable capacitor, and the frequency tuning circuit 6 can control a setting of the coarse variable capacitor to set a frequency band, the VCO 4 can be tuned across using the VCO's tuning voltage input. In certain implementations, the frequency tuning circuit 6 can be used to tune the VCO 4 to different frequency bands that collectively span multiple decades of frequency, such as from 400 MHz or less to 4 GHz or more. Additionally, the VCO 4 can include a fine variable capacitor such as a varactor whose capacitance can be controlled using the VCO's tuning voltage input. The PLL 10 can control a voltage level of the VCO's tuning voltage input to match a frequency of the feedback clock signal $CLK_{FB}$ to the reference clock signal $CLK_{REF}$ to achieve lock. During lock, the output clock signal $CLK_{OUT}$ should also be locked to the reference clock signal $CLK_{REF}$ based on a division rate of the divider 5. Inclusion of the frequency tuning circuit 6 can aid in expanding a capture range of frequencies that the PLL 10 can lock to and/or can relax VCO design constraints relative to a configuration in which a VCO includes a tuning voltage input. For example, including the frequency tuning circuit 6 to control a coarse tuning frequency of the VCO 4 can relax design requirements on the VCO's frequency control gain or $K_{VCO}$.

The illustrated PLL 10 further includes the calibration voltage generation circuit 3, which is electrically connected to the tuning voltage input of the VCO 4 through the second switch 7b.

During normal operation of the PLL 10, the first switch 7a can be controlled to a closed or low impedance state and the second switch 7b can be controlled to an opened or high impedance state. In such a configuration, the tuning voltage $V_{TUNE}$ of the VCO 4 can be controlled based on the voltage outputted from the loop filter 2. However, during a frequency band calibration or tuning of the VCO 4, the first switch 7a can be controlled to an opened state and the second switch 7b can be controlled a closed state. Although FIG. 1A illustrates a configuration using two switches, other configurations are possible, such as implementations in which the first and second switches 7a, 7b are omitted in favor of using a multi-throw switch.

During VCO frequency band calibration, the calibration voltage generation circuit 3 can generate a calibration voltage $V_{CAL}$ that can be used to set the VCO's tuning voltage input to a particular voltage level. For example, the calibration voltage generation circuit 3 can be used to control the calibration voltage $V_{CAL}$ to a level between high and low voltages, so as to provide voltage margin for the tuning voltage $V_{TUNE}$ to change in response to variations. As will be described below, in certain implementations herein the calibration voltage generation circuit 3 generates the calibration voltage $V_{CAL}$ to have temperature compensation.

Additionally, the frequency tuning circuit 6 can be used to determine a coarse frequency setting or band of the VCO 4. The frequency tuning circuit 6 can use a variety of frequency band tuning algorithms to select the coarse frequency setting. For example, in one embodiment, the frequency tuning circuit 6 can use a successive approximation (SAR) algorithm to select a VCO frequency band that includes the target frequency the VCO will be tuned to.

As will be described below, the calibration voltage generation circuit 3 can be used to generate a temperature-compensated tuning voltage.

Figure 1B:
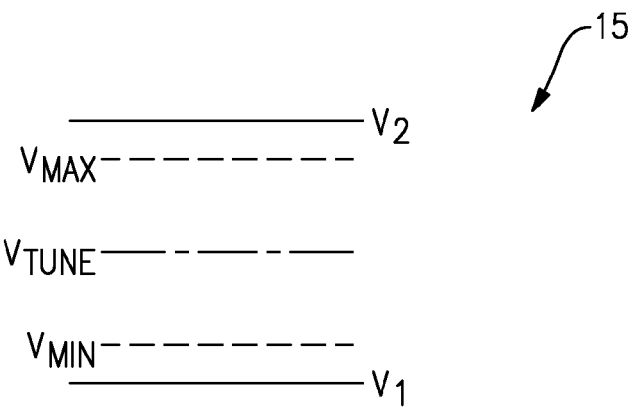
FIG. 1B is a schematic diagram illustrating one example of a tuning voltage diagram for the PLL of FIG. 1A.

FIG. 1B is a schematic diagram illustrating one example of a tuning voltage diagram 15 for the PLL 10 of FIG. 1A. The tuning voltage diagram 15 includes a voltage level of a first or low voltage $V_1$, a second or high voltage $V_2$, and a tuning voltage $V_{TUNE}$, which can change with time. The tuning voltage diagram 15 has also been annotated to include a minimum tuning voltage $V_{MIN}$ and a maximum tuning voltage $V_{MAX}$.

With reference to FIGS. 1A and 1B, during frequency band calibration or coarse tuning the VCO's tuning voltage $V_{TUNE}$ can be set between the low voltage $V_1$ and the high voltage $V_2$. During operation of the PLL 10, the PLL's feedback loop can control the tuning voltage $V_{TUNE}$ to lock the output clock signal $CLK_{OUT}$ to the reference clock signal $CLK_{REF}$.

In certain configurations, the VCO 4 can properly operate within a voltage range between the minimum tuning voltage $V_{MIN}$ and the maximum tuning voltage $V_{MAX}$. However, when the VCO's tuning voltage input has a voltage level below the minimum tuning voltage $V_{MIN}$ or above the maximum tuning voltage $V_{MAX}$, the VCO 4 may not properly operate for a variety of reasons. For example, the VCO 4 can include a varactor having a limited input voltage operating range and/or the PFD and charge pump 1 can include charge pumps that may not be able to increase the VCO's tuning voltage above the maximum tuning voltage $V_{MAX}$ or below the minimum tuning voltage $V_{MIN}$.

Accordingly, a voltage range between the minimum tuning voltage $V_{MIN}$ and the maximum tuning voltage $V_{MAX}$ can correspond to a range of voltage that the VCO's tuning voltage input can be set to during operation.

With continuing reference to FIGS. 1A and 1B, during a frequency band calibration mode of the PLL 10, the frequency tuning circuit 6 can use a variety of algorithms to set the VCO's coarse frequency setting.

When selecting a coarse frequency setting of the VCO 4, the calibration voltage $V_{CAL}$, can be controlled to a particular voltage level. For example, in one tuning scheme, the calibration voltage $V_{CAL}$, of the VCO 4 can be set mid-supply or about halfway between the low voltage $V_1$ and the high voltage $V_2$.

With the calibration voltage $V_{CAL}$ set to a particular voltage level, the frequency tuning circuit 6 can use a frequency band tuning algorithm such as a SAR algorithm to select the VCO's coarse frequency setting. After VCO frequency band calibration, the PLL 10 can be switched into an operational mode, in which the PLL controls the voltage level of the tuning voltage $V_{TUNE}$ over time to lock the output clock signal $CLK_{OUT}$ to the reference clock signal $CLK_{REF}$.

Calibrating the PLL 10 with a calibration voltage $V_{CAL}$ that is mid-supply can be suitable when the VCO operates with substantially constant temperature over time.

However, the temperature of a VCO can change over time, such as when the PLL 10 is included in a base station which is exposed to changes in ambient temperature over the course of the day. As temperature changes, the VCO's oscillation frequency can also change, and the PLL's feedback loop can adjust the tuning voltage $V_{TUNE}$ of the VCO 4 to maintain lock.

Depending on the amount of temperature variation, the PLL 10 may lose lock when the temperature changes. For example, in one embodiment, the VCO 4 has a frequency control gain or $K_{VCO}$ of about 20 MHz/V, the first low $V_1$ has a voltage of about 0 V, the second high has a voltage of about 2.7 V, the minimum tuning voltage $V_{MIN}$ has a voltage of about 0.2 V, and the maximum tuning voltage $V_{MAX}$ has a voltage of about 2.5 V. In this example, if the VCO frequency tuning is performed with a mid-supply calibration voltage of 1.35 V at 85° C., and the temperature later falls to −40° C., the PLL may lose lock, since a maximum change in the tuning voltage from 1.35V to 2.5V may provide insufficient frequency tuning to compensate for a change in the oscillator's oscillation frequency when changing the temperature from 85° C. to −40° C. Although one example of frequency control gain, voltage levels, and minimum and maximum tuning voltage levels has been provided, the example is merely illustrative, and other values are possible.

To avoid losing lock in response to temperature variation, the frequency tuning circuit 6 can tune the VCO 4 with the calibration voltage $V_{CAL}$ set to a temperature-compensated voltage. In particular, a value of the calibration voltage $V_{CAL}$ can be selected based on the temperature at which the frequency tuning circuit 6 coarsely tunes the VCO 4.

For instance, in the example described earlier, the VCO 4 has a frequency control gain of about 20 MHz/V, the low voltage $V_1$ has a voltage of about 0 V, the high voltage V2 has a voltage of about 2.7 V, the minimum tuning voltage $V_{MIN}$ has a voltage of about 0.2 V, and the maximum tuning voltage $V_{MAX}$ has a voltage of about 2.5 V. Additionally, as described above, when the VCO frequency tuning is performed with a mid-supply calibration voltage of about 1.35 V at 85° C., and the temperature later falls to −40° C., the PLL may lose lock. However, when VCO frequency tuning is performed at 85° C. using a calibration voltage $V_{CAL}$, about equal to 0.5 V, the PLL 10 can adjust the VCO's input tuning voltage from 0.5 V to 2.5 V when temperature changes from 85° C. to −40° C., which can correspond to about 40 MHz of tuning in this example. Additionally, when the VCO frequency tuning is performed at −40° C. with a calibration voltage $V_{CAL}$, about 2.5 V, the PLL 10 can adjust the VCO's input tuning voltage from 2.5V to 0.5V when temperature changes from −40° C. to 85° C.

Figure 2:
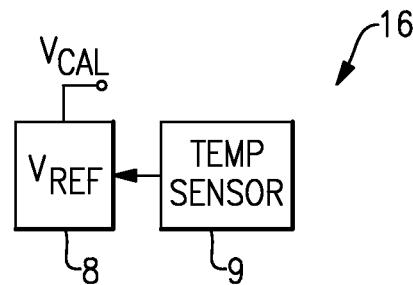
FIG. 2 is a schematic block diagram illustrating one embodiment of a calibration voltage generation circuit.

FIG. 2 is a schematic block diagram illustrating one embodiment of a calibration voltage generation circuit 16. The illustrated calibration voltage generation circuit 16 includes a reference voltage ($V_{REF}$) circuit 8 and a temperature sensor 9.

The temperature sensor 9 can generate a temperature sense signal, which can be indicative of a temperate at the PLL 10. Additionally, the temperature sensor 9 can provide the temperature sense signal to the $V_{REF}$ circuit 8, which can generate the calibration voltage $V_{CAL}$, based on the temperature sense signal. When the temperature is low, the calibration voltage $V_{CAL}$, generated by the $V_{REF}$ circuit 8 can be relatively high. Additionally, when the temperature is high, the calibration voltage $V_{CAL}$ generated by the $V_{REF}$ circuit 8 can be relatively low. Since a VCO's oscillation frequency can increase with temperature for a given tuning voltage, calibrating a VCO with a temperature-compensated calibration voltage can enhance the PLL's capability of maintaining lock in response to temperature variation.

Figure 3A:
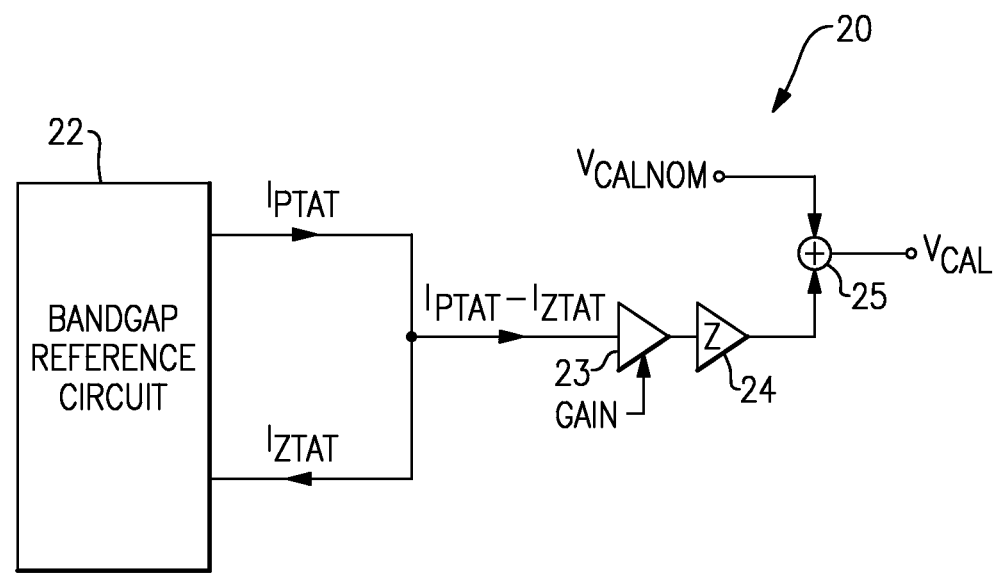
FIG. 3A is a schematic block diagram illustrating another embodiment of a calibration voltage generation circuit.

FIG. 3A is a schematic block diagram illustrating another embodiment of a calibration voltage generation circuit 20. The calibration voltage generation circuit 20 includes a bandgap reference circuit 22, a first variable-gain current amplifier 23, a transconductance (Z) amplifier 24, and an adder 25.

In the illustrated configuration, the bandgap reference circuit 22 generates a zero-to-absolute-temperature (ZTAT) current $I_{ZTAT}$ and a proportional-to-absolute temperature (PTAT) current $I_{PTAT}$. The PTAT current $I_{PTAT}$ can change in relation to the temperature sensed by the bandgap reference circuit 22 with a positive temperature coefficient, while the ZTAT current $I_{ZTAT}$ can be substantially constant with changes in temperature. As shown in FIG. 3A, the first variable-gain current amplifier 23 generates an amplified current corresponding to an amplified difference between the PTAT current $I_{PTAT}$ and the ZTAT current $I_{PTAT}$. An amount of gain of the first variable-gain current amplifier 23 can be controlled using a first gain control signal GAIN. The amplified current generated by the first variable-gain current amplifier 23 is provided to the transresistance amplifier 24, which converts the amplified current into an output voltage. The adder 25 can add the output voltage of the transresistance amplifier 24 and a nominal calibration voltage $V_{CALNOM}$ to generate the calibration voltage $V_{CAL}$.

The adder 25 can be implemented in a variety of ways. For example, in one implementation, the adder 25 can include a level shifter that shifts the output voltage of the transresistance amplifier 24 by the nominal calibration voltage $V_{CALNOM}$. In another implementation, the adder 25 is integrated into the transresistance amplifier 24. For example, the adder 25 can be implemented as a common-mode output voltage control circuit of the transresistance amplifier 24.

Although various implementations of the adder 25 have been described, other configurations are possible.

As the temperature changes from low to high, the calibration voltage $V_{CAL}$ generated by the calibration voltage generation circuit 20 can decrease. Additionally, the first gain control signal GAIN can be used to control an amount of temperature compensation in the calibration voltage $V_{CAL}$. For example, the first gain control signal GAIN can be used to change a slope of the calibration voltage $V_{CAL}$ versus temperature. In one embodiment, the first gain control signal GAIN is a digital signal used to control a programmable gain of the first variable-gain current amplifier 23.

Figure 3B:
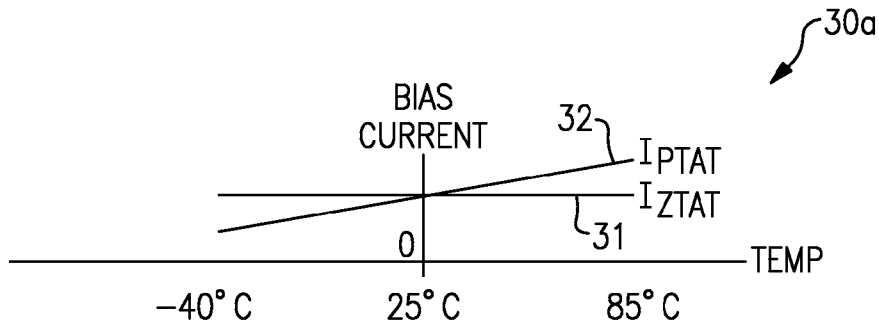
FIGS. 3B and 3C are graphs of one example of temperature versus current for the calibration voltage generation circuit of FIG. 3A.
Figure 3C:
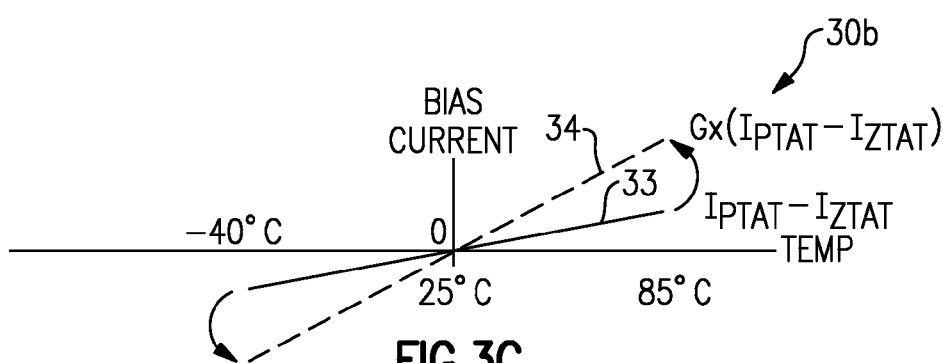

FIGS. 3B and 3C are graphs of one example of temperature versus current for the calibration voltage generation circuit 20 of FIG. 3A.

FIG. 3B illustrates a first graph 30*a* including a first plot 31 of the ZTAT current $I_{ZTAT}$ versus temperature and a second plot 32 of the PTAT current $I_{PTAT}$ versus temperature. FIG. 3C illustrates a second graph 30*b* including a third plot 33 of a difference between the PTAT current $I_{PTAT}$ and the ZTAT current $I_{ZTAT}$. FIG. 3C further includes a fourth plot 34 of an amplified current $G \times (I_{PTAT} - I_{ZTAT})$, which corresponds to an amplified difference between PTAT current $I_{PTAT}$ and the ZTAT current $I_{ZTAT}$. The amplified current $G \times (I_{PTAT} - I_{ZTAT})$ can correspond to the output current of the first variable-gain current amplifier 23 of FIG. 3A when the first gain control signal GAIN has a gain value of G.

Figure 3D:
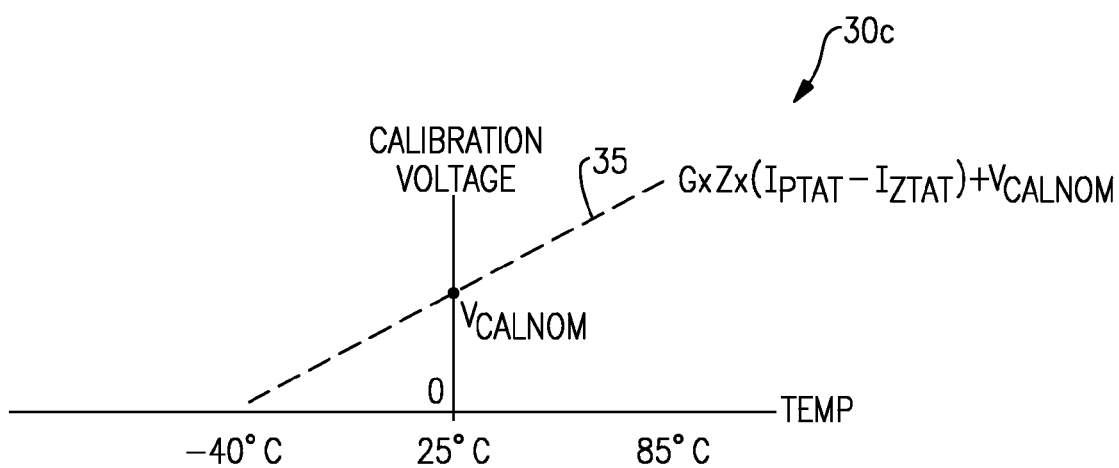
FIG. 3D is a graph of one example of temperature versus calibration voltage for the calibration voltage generation circuit of FIG. 3A.

FIG. 3D is a graph 30*c* of one example of temperature versus calibration voltage for the calibration voltage generation circuit of FIG. 3A. FIG. 3D includes a fifth plot 35 of the calibration voltage $V_{CAL}$ corresponding to one example of the calibration voltage for a setting of the first gain control signal GAIN.

As shown in FIG. 3D, the calibration voltage $V_{CAL}$ can have a value about equal to the nominal calibration voltage $V_{CALNOM}$ at about 25° C. By selecting the nominal calibration voltage $V_{CALNOM}$, the transresistance of the transresistance amplifier 24, and a value of the first gain control signal GAIN, a desired amount of compensation for the calibration voltage $V_{CAL}$ versus temperature can be achieved.

Figure 3E:
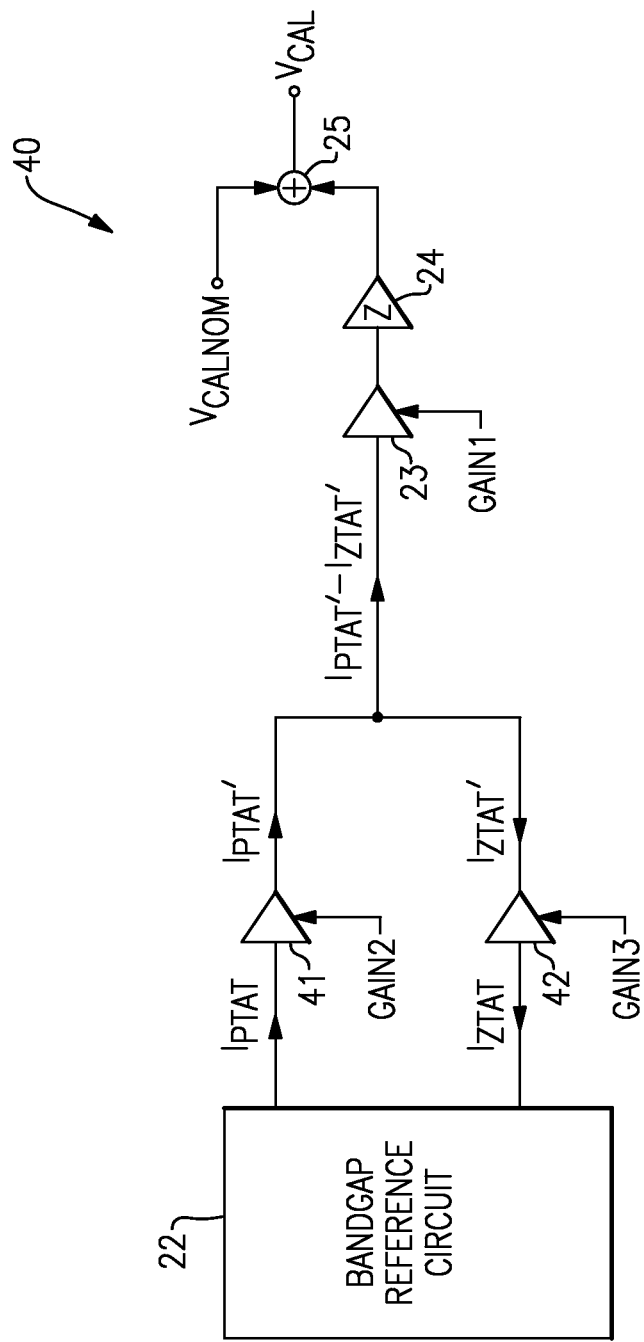
FIG. 3E is a schematic block diagram illustrating another embodiment of a calibration voltage generation circuit.

FIG. 3E is a schematic block diagram illustrating another embodiment of a calibration voltage generation circuit 40. The calibration voltage generation circuit 40 includes a bandgap reference circuit 22, a first variable-gain current amplifier 23, a second variable-gain current amplifier 41, a third variable-gain current amplifier 42, a transresistance (Z) amplifier 24, and an adder 25.

The calibration voltage generation circuit 40 of FIG. 3E is similar to the calibration voltage generation circuit 20 of FIG. 3A, except that the calibration voltage generation circuit 40 further includes the second variable-gain current amplifier 41 and the third variable-gain current amplifier 42. As shown in FIG. 3E, the second variable-gain current amplifier 41 is configured to amplify the PTAT current $I_{PTAT}$ to generate an amplified PTAT current $I_{PTAT'}$ based on a second gain control signal GAIN2. Additionally, the third variable-gain current amplifier 42 is configured to amplify the ZTAT current $I_{ZTAT}$ to generate an amplified ZTAT current $I_{ZTAT'}$ based on a third gain control signal GAIN3. A difference between the amplified PTAT current $I_{PTAT'}$ and the amplified ZTAT current $I_{ZTAT'}$ is provided to the first variable-gain current amplifier 23, which generates an amplified current based on the first gain control signal GAIN1. Additional details of the calibration voltage generation circuit 40 can be similar to those described earlier.

Providing the second and third variable-gain current amplifiers 42, 43 can provide enhanced control over the profile of the calibration voltage $V_{CAL}$ versus temperature. In certain implementations, the second and third variable-gain current amplifiers 42, 43 can be used to compensate for non-idealities in a circuit topology or layout of the calibration voltage generation circuit and/or a particular process used to manufacture the calibration voltage generation circuit.

Although FIGS. 2, 3A, and 3E illustrate three configurations of a voltage calibration generation circuit in accordance with the teachings herein, other implementations are possible.

Overview of PLLs Including a Frequency Tuning Circuit with a Tuning Voltage Monitor In certain implementations, a PLL's frequency tuning circuit includes a tuning voltage monitor. The tuning voltage monitor can be used to detect a voltage level of the VCO's tuning voltage input. After the frequency tuning circuit selects a coarse frequency setting or frequency band of the VCO, the tuning voltage monitor can be used to sense a tuning voltage level of the VCO associated with the setting. In certain implementations, the tuning voltage level can be sensed by closing the PLL's feedback loop and measuring a voltage of the VCO's tuning input after the PLL settles. The frequency tuning circuit can determine when an incorrect coarse frequency setting of the VCO has been selected by determining when the tuning voltage is outside an acceptable tuning voltage range. After detection of a calibration error, the coarse frequency setting of the VCO can be adjusted, such as by incremented or decremented the coarse frequency setting as needed until the tuning voltage is brought within the desired tuning voltage range.

Figure 4A:
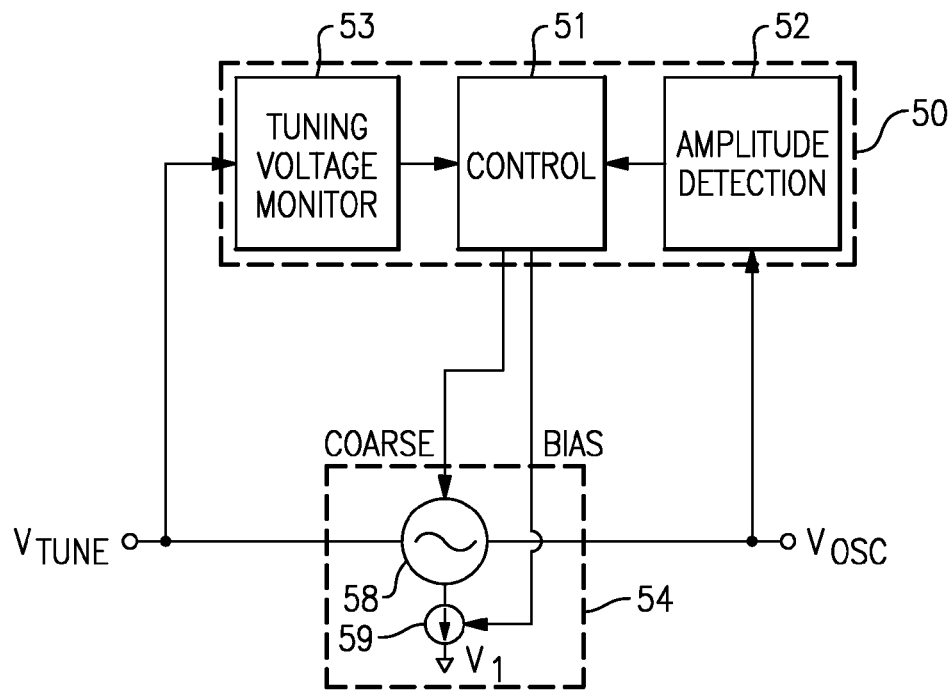
FIG. 4A is a schematic block diagram of a frequency tuning circuit and a voltage controlled oscillator (VCO) according to one embodiment.

FIG. 4A is a schematic block diagram of a frequency tuning circuit 50 and a voltage controlled oscillator (VCO) 54 according to one embodiment. The frequency tuning circuit 50 includes a control circuit 51, an amplitude detection circuit 52, and a tuning voltage monitor 53. As shown in FIG. 4A, the frequency tuning circuit 50 generates a coarse control signal COARSE and a bias control signal BIAS for the VCO 54. The frequency tuning circuit 50 of FIG. 4A illustrates one embodiment of a frequency tuning circuit that can be used in a PLL, such as the PLL 10 of FIG. 1A.

The VCO 54 includes an oscillation circuit 58 and a variable current source 59. The oscillation circuit 58 receives a tuning voltage $V_{TUNE}$ and generates an oscillator voltage $V_{OSC}$, which can be single-ended or differential. A voltage level of the tuning voltage $V_{TUNE}$ can provide fine-tuned control of the VCO's oscillation frequency to achieve PLL lock. Additionally, the coarse control signal COARSE generated by the control circuit 51 can be used to provide coarse frequency adjustment of the VCO's oscillation frequency. The variable current source 59 can be used to generate a bias current of the oscillation circuit 58. As shown in FIG. 4A, an amount of the bias current can be controlled using the bias control signal BIAS generated by the control circuit 51.

The amplitude detection circuit 52 can be used to detect an amplitude of the oscillator voltage $V_{OSC}$, and to provide an amplitude detection signal to the control circuit 51. Additionally, the control circuit 51 can use the bias control signal BIAS to control an amount of bias current generated by the variable current source 59 to set the amplitude of the oscillator voltage $V_{OSC}$ to a desired level or within a desired range. For example, increasing the bias current can increase the amplitude of the oscillator voltage $V_{OSC}$, while decreasing the bias current can decrease the amplitude of the oscillator voltage $V_{OSC}$.

The tuning voltage monitor 53 can be used to detect a level of the tuning voltage $V_{TUNE}$, and to provide a tuning voltage detection signal to the control circuit 51. The tuning voltage monitor 53 can be used to compare a voltage of the tuning voltage $V_{TUNE}$ to one or more reference voltages, and to generate the tuning voltage detection signal based on the result.

During frequency band calibration of the VCO 54, the frequency tuning circuit 50 can be used to set the VCO's coarse frequency setting. For example, in one embodiment, the control circuit 51 can be used to implement a successive approximation (SAR) algorithm to set a coarse capacitor digital-to-analog (DAC) code of the VCO 54.

For a variety of reasons, the control circuit 51 may incorrectly set the coarse control signal of the VCO 54 during a frequency band tuning algorithm. In one example, the correct coarse control signal value may not be set because manufacturing errors and/or parasitic effects may result in the coarse control signal behaving non-linearly, which can result in errors in the frequency band tuning algorithm and selection of the coarse control signal setting. In another example, a limited or finite frequency band calibration time for a PLL can result in selection of an incorrect coarse control signal setting, since the limited calibration time may provide insufficient time for the PLL to settle or lock during one or more steps of the frequency band tuning algorithm.

The illustrated tuning voltage monitor 53 can be used to detect an incorrect coarse control signal setting by detecting a tuning voltage $V_{TUNE}$ of the VCO 54 after frequency band calibration. For example, when properly calibrated, the tuning voltage $V_{TUNE}$ of the VCO 54 can fall within a range of acceptable values. Thus, after the VCO 54 has been calibrated and the PLL's control loop is allowed to settle with a certain coarse control signal setting, the tuning voltage monitor 53 can monitor the tuning voltage $V_{TUNE}$. Additionally, when the tuning voltage monitor 53 determines that the tuning voltage $V_{TUNE}$ falls outside an acceptable voltage range, the control circuit 51 can determine that the coarse control signal has been incorrectly set.

When an error has been detected, the control circuit 51 can adjust the coarse control signal setting until the tuning voltage $V_{TUNE}$ is brought within the desired range. In one embodiment, when the tuning voltage monitor 53 determines that the tuning voltage $V_{TUNE}$ is too high, the control circuit 51 can repeatedly decrement the coarse control signal setting to decrease the VCO's capacitance until the tuning voltage $V_{TUNE}$ is brought within the desired range. Additionally, when the tuning voltage monitor 53 determines that the tuning voltage $V_{TUNE}$ is too low, the control circuit 51 can repeatedly increment the coarse control signal setting to increase the VCO's capacitance until the tuning voltage $V_{TUNE}$ is brought within the desired range. In certain implementations, the control circuit 51 increments or decrements the coarse control signal by adding or subtracting a least significant bit (LSB) of the coarse control signal. In another embodiment, the control circuit 51 is provided with sub-LSB resolution, and can increment or decrement the coarse control signal using a fraction of an LSB.

Figure 4B:
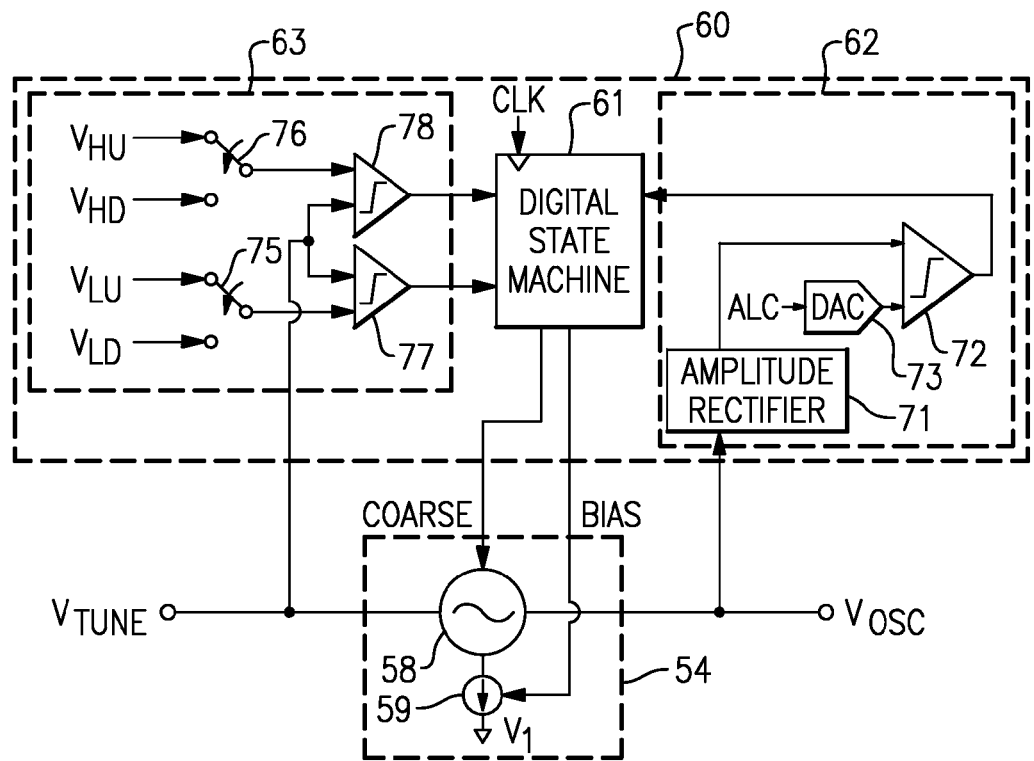
FIG. 4B is a schematic block diagram of a frequency tuning circuit and a VCO according to another embodiment.

FIG. 4B is a schematic block diagram of a frequency tuning circuit 60 and an oscillator 54 according to another embodiment. The frequency tuning circuit 60 includes a digital state machine 61, an amplitude detection circuit 62, and a tuning voltage monitor 63.

The frequency tuning circuit 60 of FIG. 4B is similar to the frequency tuning circuit 50 of FIG. 4A, except that the frequency tuning circuit 60 illustrates one implementation of the control circuit 51, the amplitude detection circuit 52, and the tuning voltage monitor 53 of FIG. 4A.

As shown in FIG. 4B, the digital state machine 61 receives a clock signal CLK, a low tuning voltage comparison signal, a high tuning voltage comparison signal, and an amplitude detection signal. Furthermore, the digital state machine 61 generates a coarse capacitance control signal COARSE and a bias control signal BIAS.

In certain implementations, the clock signal CLK corresponds to a divided version of a clock signal provided to a PLL's phase-frequency detector. For example, in one embodiment, the clock signal CLK corresponds to the reference clock signal $CLK_{REF}$ of FIG. 1A divided by an integer N greater than or equal to 1.

The amplitude detection circuit 62 includes an amplitude rectifier 71, an amplitude comparator 72, and a digital-to-analog converter (DAC) 73. The amplitude rectifier 71 can rectify the oscillator signal $V_{OSC}$ to generate a rectified signal. The DAC 73 can generate an amplitude threshold based on an amplitude level indicated by the amplitude control signal ALC. The amplitude comparator 72 can compare the rectified signal to the amplitude threshold generated by the DAC 73. The amplitude comparator 72 includes an output that generates the amplitude detection signal, which is provided to the digital state machine 61.

In certain implementations, the digital state machine 61 controls the amplitude control signal ALC to two or more different values during operation, such that the VCO's amplitude can be compared to multiple threshold levels using the amplitude comparator 72. Configuring the frequency tuning circuit 60 in this manner can aid is comparing the VCO's amplitude to both high and low amplitude threshold levels, thereby determining whether or not the VCO's amplitude is within a certain amplitude range. However, other configurations are possible, such as implementations in which the amplitude detection circuit 62 includes multiple comparators and/or implementations in which the amplitude comparator 72 is used to compare the VCO's amplitude to a single threshold level.

During frequency band calibration of the VCO 54, the amplitude detection circuit 62 can compare the magnitude of the VCO's amplitude to one or more amplitude threshold levels. Additionally, the digital state machine 61 can be used to control the bias control signal BIAS so as to tune the VCO's amplitude based on the comparisons to the one or more amplitude threshold levels. For example, in one embodiment, the digital state machine 61 sets the bias control signal BIAS to a setting associated with the VCO's amplitude being greater that a low amplitude threshold. In another embodiment, the digital state machine 61 sets the bias control signal BIAS to a setting associated with the VCO's amplitude being greater than a low amplitude threshold but smaller than a high amplitude threshold. Additional details of the amplitude detection circuit 62 can be similar to those described earlier.

The tuning voltage monitor 63 includes a first multi-throw switch 75, a second multi-throw switch 76, a first comparator 77, and a second comparator 78. The first multi-throw switch 75 can be used to provide either a first low threshold voltage $V_{LD}$ or a second low threshold voltage $V_{LU}$ to the first comparator 77. The first comparator 77 can be used to determine whether the tuning voltage $V_{TUNE}$ is greater than the first low threshold voltage $V_{LD}$, and whether the tuning voltage $V_{TUNE}$ is greater than the second low threshold voltage $V_{LU}$. The second multi-throw switch 76 can be used to provide either a first high threshold voltage $V_{HU}$ or a second high threshold voltage $V_{HD}$ to the second comparator 78. The second comparator 78 can be used to determine whether the tuning voltage $V_{TUNE}$ is less than the first high threshold voltage $V_{HU}$, and whether the tuning voltage $V_{TUNE}$ is less than the second high threshold voltage $V_{HL}$.

The tuning voltage monitor 63 of FIG. 4B illustrates one implementation of the tuning voltage monitor 53 of FIG. 4A. However, other configurations are possible, including, for example, configurations using different circuit topologies and/or configurations using more or fewer comparators. For example, in one implementation, the first and second multi-throw switches 75, 76 are omitted in favor of using additional comparators.

The first low threshold voltage $V_{LD}$ can have a voltage less than the second low threshold voltage $V_{LU}$. For instance, in one implementation, the first low threshold voltage $V_{LD}$ has a voltage of about 700 mV and the second low threshold voltage $V_{LU}$ has a voltage of about 900 mV. Furthermore, the first high threshold voltage $V_{HU}$ can have a voltage greater than the second high threshold voltage $V_{HD}$. For instance, in one implementation, the first high threshold voltage $V_{HD}$ has a voltage of about 2,500 mV and the second high threshold voltage $V_{HD}$ has a voltage of about 2,300 mV. Although one example of threshold voltage values has been provided, other configurations are possible. In one embodiment, the first and second low threshold voltages $V_{LD}$, $V_{LU}$ and the first and second high threshold voltage $V_{HU}$, $V_{HL}$ are programmable.

In certain implementations, when the tuning voltage monitor 63 determines that the tuning voltage $V_{TUNE}$ is less than the first low threshold voltage $V_{LD}$, the digital state machine 61 can repeatedly increment the coarse control signal setting to increase the VCO's capacitance until the tuning voltage monitor 63 determines that the tuning voltage $V_{TUNE}$ is greater than the second low threshold voltage $V_{LU}$. Additionally, when the tuning voltage monitor 63 determines that the tuning voltage $V_{TUNE}$ is greater than the first high threshold voltage $V_{HU}$, the digital state machine 61 can repeatedly decrement the coarse control signal setting to decrease the VCO's capacitance until the tuning voltage monitor 63 determines that the tuning voltage $V_{TUNE}$ is less than the second high threshold voltage $V_{HD}$. Configuring the digital state machine 61 in this manner can set the tuning voltage $V_{TUNE}$ at a voltage greater than the second low threshold voltage $V_{LU}$, but less than the second high threshold voltage $V_{HD}$.

Figure 5:
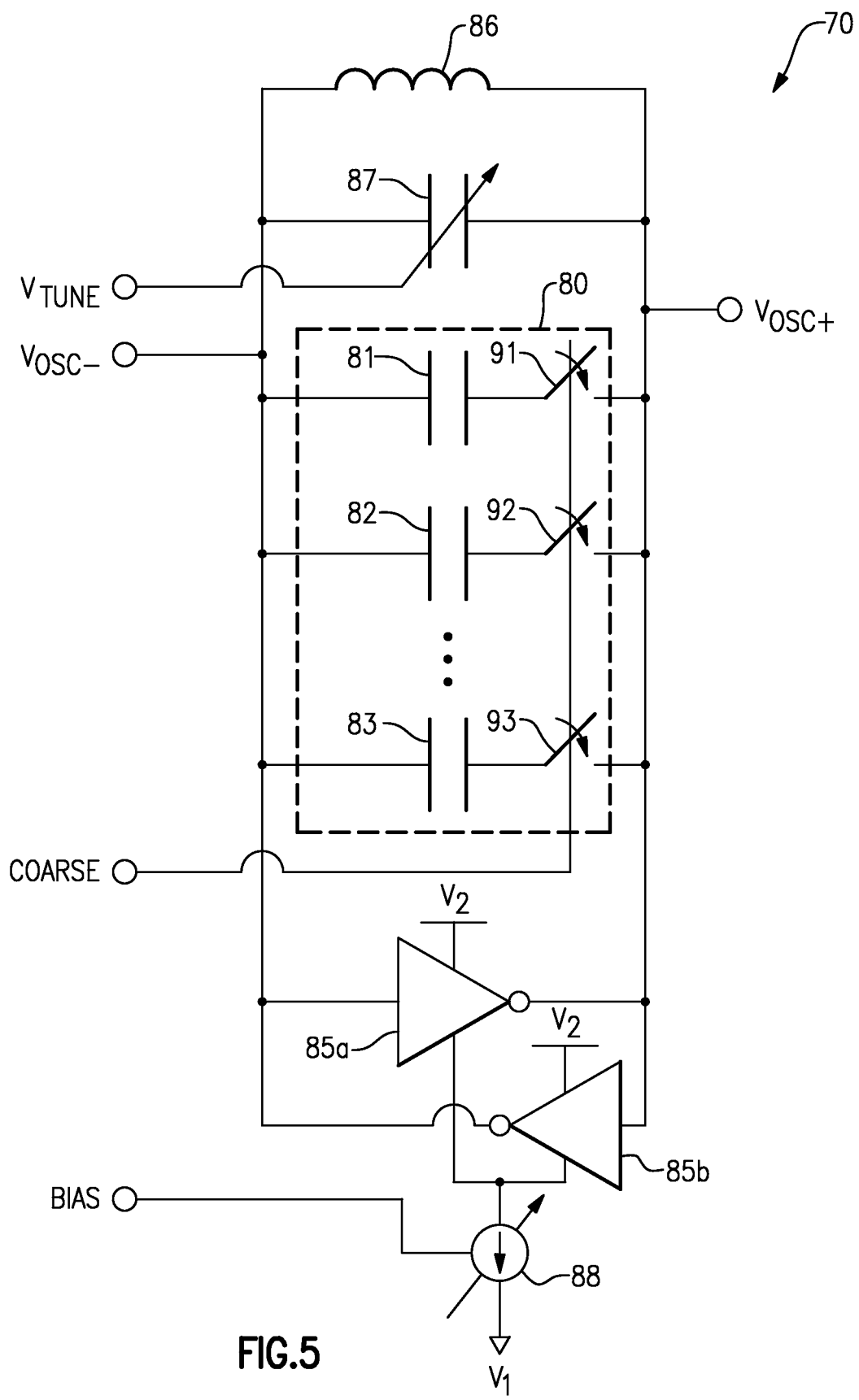
FIG. 5 is a schematic block diagram of one embodiment of a VCO.

FIG. 5 is a schematic block diagram of one embodiment of a VCO 70. The VCO 70 includes a coarse variable capacitor 80, first and second inverting amplification circuits 85a, 85b, an inductor 86, a varactor 87, and a variable current source 88. The VCO 70 receives a tuning voltage $V_{TUNE}$, receives a bias control signal BIAS, receives a coarse capacitance control signal COARSE, and generates a differential oscillator voltage corresponding to a difference between a positive or non-inverted oscillator voltage $V_{OSC+}$ and a negative or inverted oscillator voltage $V_{OSC-}$. Although FIG. 5 illustrates a differential configuration of a VCO, the teachings herein are applicable to single-ended configurations.

In the illustrated configuration, the first and second inverting amplification circuits 85a, 85b are electrically connected in a back-to-back configuration. For example, the first inverting amplification circuit 85a includes an input electrically connected to an output of the second inverting amplification circuit 85b, and an output electrically connected to an input of the second inverting amplification circuit 85b. The inductor 86 is electrically connected between the input of the first inverting amplification circuit 85a and the output of the first inverting amplification circuit 85a, and between the output of the second inverting amplification circuit 85b and the input of the second inverting amplification circuit 85b. Additionally, the varactor 87 is electrically connected between the first inverting amplification circuit's input and output, and between the second inverting amplification circuit's output and input. As shown in FIG. 5, the varactor 87 is controlled by the tuning voltage $V_{TUNE}$. Since the VCO's frequency can be based on the inductance and capacitance connected between the first inverting amplification circuit's input and output and between the second inverting amplification circuit's output and input, changing a level of the tuning voltage $V_{TUNE}$ can be used to control the VCO's frequency.

The first and second inverting amplification circuits 85a, 85b are configured to receive a bias current from the variable current source 88. As shown in FIG. 5, the variable current source 88 can be controlled using the bias control signal BIAS. Increasing the bias current can increase an amplitude of the differential oscillator voltage $V_{OSC+}$, $V_{OSC-}$. Additionally, decreasing the bias current can decrease the amplitude of the differential oscillator voltage $V_{OSC+}$, $V_{OSC-}$.

Although FIG. 5 illustrates a configuration in which the first and second inverting amplification circuits 85a, 85b receive current from a common current source, the teachings herein are applicable to configurations in which amplifications circuits receive current from separate current sources. Furthermore, although FIG. 5 illustrates a configuration using two inverting amplifications circuits, the teachings herein are applicable to configurations using more or fewer inverting amplification circuits, including, for example, configurations using a single inverting amplification circuit. Moreover, the teachings herein are applicable to configurations using non-inverting amplification circuits, or to configurations using a combination of inverting and non-inverting amplification circuits.

The coarse variable capacitor 80 includes first to third capacitors 81-83 and first to third switches 91-93. Although the coarse variable capacitor 80 is illustrated for an implementation including three capacitors and three switches, more or fewer capacitors and switches can be used. The first capacitor 81 and the first switch 91 are connected in series between an input and an output of the first inverting amplification circuit 85a, and between an output and an input of the second inverting amplification circuit 85b. Similarly, the second capacitor 82 and the second switch 92 are connected in series between the first inverting amplification circuit's input and output and between the second inverting amplification circuit's output and input. Furthermore, the third capacitor 83 and the third switch 93 are connected in series between the first inverting amplification circuit's input and output and between the second inverting amplification circuit's output and input.

In the illustrated configuration, the coarse capacitance control signal COARSE is a multi-bit signal used to selectively open or close the first to third switches 91-93, thereby controlling an active capacitance of the VCO 70. The coarse capacitance control signal COARSE can be used to selectively connect all, none, or a portion of the capacitors 81-83 between the amplification circuits' inputs and outputs, thereby controlling the VCO's oscillation frequency.

The VCO 70 illustrates one example of an inductor-capacitor (LC) tank oscillator that can be used to implement the VCO 54 of FIGS. 4A and 4B and/or the VCO 4 of FIG.

1A. However, the teachings herein are applicable to other configurations of VCOs, including, for example, VCOs implemented using other circuit topologies and/or using other variable capacitance structures. As used herein, a "variable capacitor" can include not only analog controlled capacitors such as varactors, but also digitally controlled capacitors such as programmable/selectable capacitors in which an amount of capacitance can be varied by switching in and out capacitance. Furthermore, although FIG. 5 illustrates a configuration in which the VCO outputs a differential voltage, the teachings herein are applicable to configurations using a singled-ended output voltage, or to configuration in which the VCO outputs a single-ended or differential current signal.

Overview of Frequency Tuning Circuits Providing Dynamic VCO Gain Adjustment

With reference back to FIG. 1A, after the VCO 4 is coarsely tuned using the frequency tuning circuit 6, the PLL 10 can be set to an operational mode and used to lock the output clock signal $CLK_{OUT}$ to the reference clock signal $CLK_{REF}$.

During operation of the PLL 10, changes in operating conditions such as temperature and/or supply variations can occur. The variations can change a voltage level of the tuning voltage $V_{TUNE}$ needed to maintain lock. Absent compensation, the tuning voltage $V_{TUNE}$ may drift and exceed a maximum operational voltage (for example, $V_{MAX}$ of FIG. 2) or fall below a minimum operational voltage (for example, $V_{MIN}$ of FIG. 2), thereby causing the PLL 10 to lose lock.

However, the PLL 10 may operate in an electronic system in which it may not be practical for the PLL 10 to lose lock. For example, the PLL 10 may be included in a base station of a cellular network, and loss of lock can result in dropped calls.

In certain implementations, a PLL includes a frequency tuning circuit that is used to dynamically adjust the VCO's gain during operation of the PLL to compensate for variations in supply and/or temperature. The frequency tuning circuit can include a control circuit such as a finite state machine that can be used to adjust the VCO's gain during operation of the PLL by adjusting a bias current of the VCO. For example, the frequency tuning circuit can be used to adjust a bias current of the VCO, thereby changing the VCO's frequency control gain or $K_{VCO}$.

Furthermore, in certain implementations, the VCO can include an amplitude detection circuit for monitoring the VCO's output amplitude in response to changes in the bias current. In certain configurations, when the VCO's amplitude falls below a first threshold level and/or exceeds a second threshold level, the control circuit can stop adjusting the bias current. Thereafter, the control circuit can adjust a setting of a fine variable capacitor of the VCO. Configuring the frequency tuning circuit in this manner can aid in preventing the output amplitude of the VCO from becoming too small and/or too large in response to bias current adjustments. In certain configurations, a difference in capacitance between adjacent settings of the fine variable capacitor can be relatively small, such that the PLL should not lose lock and/or its output should not be significantly disturbed when the fine variable capacitor setting is incremented or decremented.

Figure 6:
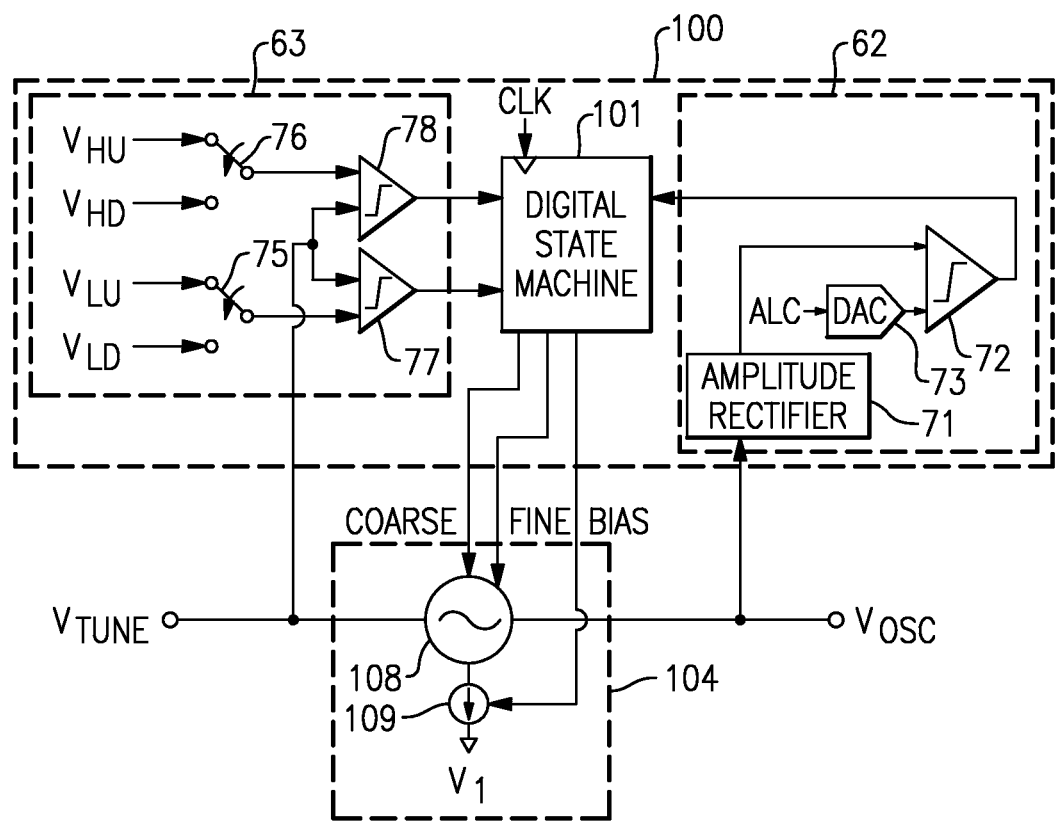
FIG. 6 is a schematic block diagram of a frequency tuning circuit and a VCO according to another embodiment.

FIG. 6 is a schematic block diagram of a frequency tuning circuit 100 and an oscillator 104 according to another embodiment. The frequency tuning circuit 100 includes a digital state machine 101, an amplitude detection circuit 62, and a tuning voltage monitor 63.

The frequency tuning circuit 100 of FIG. 6 is similar to the frequency tuning circuit 60 of FIG. 4B, except that the digital state machine 101 further generates a fine capacitance control signal FINE for the VCO 104, which includes an oscillation circuit 108 and a variable current source 109. The fine capacitance control signal FINE can be used to provide fine control of the VCO's oscillation frequency band.

As shown in FIG. 6, the digital state machine 101 provides the bias control signal BIAS to the variable current source 109. In certain implementations, the variable current source 109 includes a current source DAC, and the bias control signal BIAS is used to control a number of active current sources. In certain implementations, the smallest of the active current sources has a current magnitude less than or equal to 10 uA. Configuring the current sources in this manner can reduce likelihood that the PLL loses lock or its output be disturbed when the bias control signal BIAS changes value during operation of the PLL. Furthermore, in certain implementations, an output of the current source DAC can include an on-chip and/or off-chip capacitor to filter output glitches associated with DAC code switching.

In certain implementations, the VCO's gain can change with the VCO's bias current. For example, in one embodiment the VCO's frequency control gain or $K_{VCO}$ can increase with a decrease in bias current, and can decrease with an increase in bias current.

When a PLL including the frequency tuning circuit 100 and the oscillator 104 is in operation, the amplitude detection circuit 62 can monitor the amplitude of the oscillation voltage $V_{OSC}$, and the tuning voltage monitor 63 can monitor the voltage level of the tuning voltage $V_{TUNE}$. In certain configurations, the amplitude detection circuit 62 determines whether the amplitude of the oscillation voltage $V_{OSC}$ is within an acceptable amplitude range, and the tuning voltage monitor 63 determines whether the voltage level of the tuning voltage $V_{TUNE}$ is within an acceptable tuning voltage range.

In certain implementations, the tuning voltage monitor 63 determines whether the tuning voltage is within an acceptable tuning voltage range based on comparisons of the tuning voltage $V_{TUNE}$ to the first low threshold voltage $V_{LD}$, the first high threshold voltage $V_{HU}$, the second low threshold voltage $V_{LU}$, and the second high threshold voltage $V_{HD}$. For example, in one embodiment, when the tuning voltage monitor 63 determines that the tuning voltage $V_{TUNE}$ is less than about the first low threshold voltage $V_{LD}$, the tuning voltage monitor 63 can increase the bias control signal BIAS to decrease the VCO's gain until the tuning voltage monitor 63 determines that the tuning voltage $V_{TUNE}$ is greater than about the second low threshold voltage $V_{LU}$. Additionally, when the tuning voltage monitor 63 determines that the tuning voltage $V_{TUNE}$ is greater than about the first high threshold voltage $V_{HU}$, the tuning voltage monitor 63 can decrease the bias control signal BIAS to increase the VCO's gain until the tuning voltage monitor 63 determines that the tuning voltage $V_{TUNE}$ is less than about the second high threshold voltage $V_{HD}$.

By configuring the frequency tuning circuit 100 in this manner, the tuning voltage $V_{TUNE}$ can be maintained within a tuning voltage window between about the second low threshold voltage $V_{LU}$ and about the second high threshold voltage $V_{HD}$. Maintaining the tuning voltage $V_{TUNE}$ within the tuning voltage window can aid the PLL to remain locked with temperature and supply variations.

As described earlier, the amplitude detection circuit 62 can compare the magnitude of the VCO's amplitude to one or more amplitude threshold levels by controlling the amplitude level control signal ALC. Although the amplitude detection circuit 62 is illustrated for a configuration in which the amplitude detection circuit 62 provides comparisons of an oscillation voltage signal of the VCO, the teachings herein are applicable to configurations in which the amplitude detection circuit provides comparisons of an oscillation current signal.

The digital state machine 101 can be used to control the bias control signal BIAS so as to tune the VCO's amplitude based on the comparisons to the one or more amplitude threshold levels. For example, in one embodiment, the digital state machine 101 sets the bias control signal BIAS to a setting associated with the VCO's amplitude being greater than a low amplitude threshold but smaller than a high amplitude threshold.

In certain implementations, the frequency tuning circuit 100 can stop changing the bias control signal BIAS when the amplitude detection circuit 62 determines that the VCO's amplitude has a value that is smaller than a low amplitude threshold and/or greater than a high amplitude threshold. Configuring the frequency tuning circuit 100 in this manner can help prevent the frequency tuning circuit 100 from adjusting the bias control signal BIAS in a manner that results in the VCO's amplitude being too small for oscillation at the operating temperature and/or too large to meet device breakdown or long-term reliability constraints.

For example, in one embodiment, the digital state machine 101 can step through codes of the bias control signal BIAS while observing the output of the amplitude detection circuit 62 for comparisons to both a low amplitude threshold and a high amplitude threshold. Additionally, when the amplitude detection circuit 62 indicates that the amplitude is smaller than the low amplitude threshold or greater than the high amplitude threshold, the digital state machine 101 can stop adjusting the bias control signal BIAS.

In certain configurations, controlling the bias control signal BIAS may provide insufficient tuning range to control the tuning voltage $V_{TUNE}$ within the tuning voltage window controlled by the threshold voltages $V_{HU}$, $V_{HL}$, $V_{DU}$, $V_{DL}$. The failure to control the tuning voltage $V_{TUNE}$ can be caused by, for example, limitations on VCO amplitude and/or an insufficient number of settings of the bias control signal BIAS.

In one embodiment, when the digital state machine 101 is unable to control the bias control signal BIAS to bring the tuning voltage $V_{TUNE}$ within the tuning voltage window, the digital state machine can adjust the VCO's frequency using a fine capacitance control signal FINE. The fine capacitance control signal FINE can be used to control a fine variable capacitor of the VCO 104. For example, the VCO 104 can include a fine capacitor DAC, such as a bank of relatively small varactors and/or metal-insulator-metal (MIM) capacitors, which can be controlled using the fine capacitance control signal FINE.

The fine capacitance control signal FINE can provide a capacitance change of the VCO 104 that is relatively small. For example, in one embodiment, a change in the least significant bit (LSB) of the fine capacitance control signal FINE can result in a capacitance change of less than about 1 ff. Configuring the fine capacitance control signal FINE to provide small capacitance changes can help prevent a change in the fine capacitance control signal FINE value resulting in a sudden frequency step at the VCO's output, which can result in the PLL losing lock and/or having its output disturbed.

In certain implementations, adjustment of the bias control signal BIAS can have a lower risk of a PLL losing lock and/or a smaller impact on a PLL's output phase being disturbed relative to an adjustment of the fine capacitance control signal FINE. Accordingly, in one embodiment, the digital state machine 101 adjusts the fine capacitance control signal FINE only after the digital state machine 101 is unable to bring the tuning voltage $V_{TUNE}$ within the tuning voltage window by adjustment of the bias control signal BIAS.

Figure 7:
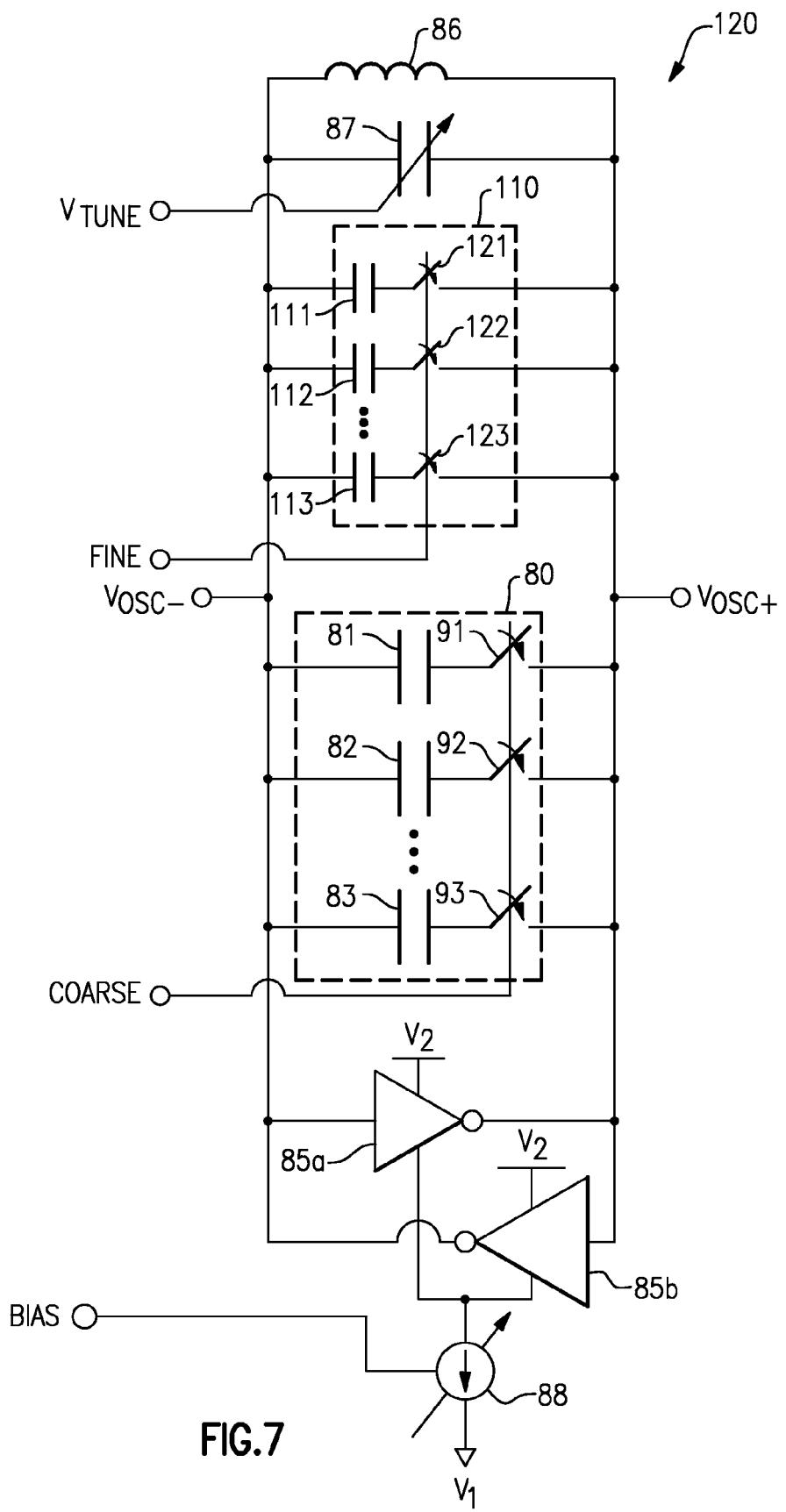
FIG. 7 is a schematic block diagram of another embodiment of a VCO.

FIG. 7 is a schematic block diagram of another embodiment of a VCO 120. The VCO 120 of FIG. 7 is similar to the VCO 70 of FIG. 5, except that the VCO 120 further includes a fine variable capacitor 110.

The illustrated fine variable capacitor 110 includes first to third capacitors 111-113 and first to third switches 121-123. Although the fine variable capacitor 110 is illustrated for an implementation including three capacitors and three switches, more or fewer capacitors and switches can be used. The first capacitor 111 and the first switch 121 are connected in series between an input and an output of the first inverting amplification circuit 85a and between the output and input of the second inverting amplification circuit 85b. Similarly, the second capacitor 112 and the second switch 122 are connected in series between the first inverting amplification circuit's input and output and between the second inverting amplification circuit's output and input. Furthermore, the third capacitor 113 and the third switch 123 are connected in series between the first inverting amplification circuit's input and output and between the second inverting amplification circuit's output and input.

In the illustrated configuration, the bits of the fine capacitance control signal FINE can be used to selectively open or close the first to third switches 121-123, thereby controlling an oscillation frequency of the VCO 120. The fine capacitance control signal FINE can be used to selectively connect all, none, or a portion of the capacitors 111-113 between the input and output of the first inverting amplification circuit 85a and between the output and input of the second inverting amplification circuit 85b, thereby controlling the VCO's oscillation frequency.

The VCO 120 illustrates one implementation of a VCO that can be used in accordance with the teachings herein. However, other configurations are possible, including, for example, configurations using a different circuit topology and/or configurations in which the coarse and/or fine variable capacitors are implemented in using other variable capacitance structures.

Examples of Simulation Results

FIGS. 8-12 illustrate various examples of simulation results. Although certain specific simulation results are shown, simulation results can depend on a variety of factors, including, for example, circuit implementation details and/or transistor models. Accordingly, simulation results can vary.

Figure 8:
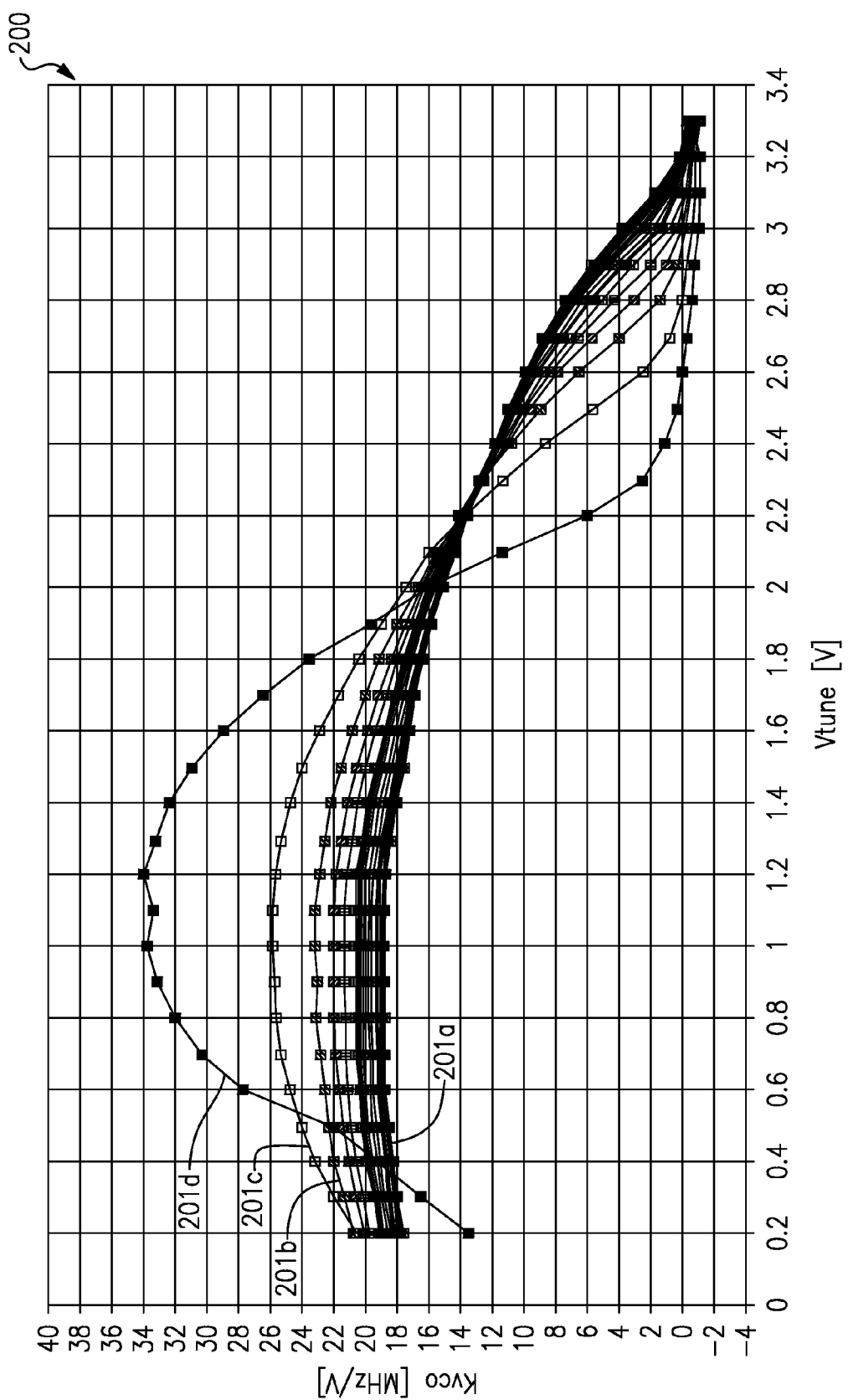
FIG. 8 shows a graph of one example of tuning voltage versus frequency control gain of a VCO for various amounts of bias current.

FIG. 8 shows a graph 200 of one example of tuning voltage ($V_{TUNE}$) versus frequency control gain ($K_{VCO}$) of a VCO for various amounts of bias current. The graph 200 includes a plurality of plots of $V_{TUNE}$ versus $K_{VCO}$ for different bias current levels, including a first plot 201a, a second plot 201a, a third plot 201c, and a fourth plot 201d. The first plot 201a can correspond to an amount of VCO bias current that is greater than the VCO bias current associated with the second plot 201b. Additionally, the second plot 201b can correspond to an amount of VCO bias current that is greater than the VCO bias current associated with the third plot 201c, and the third plot 201c can correspond to an amount of VCO bias current that is greater than the VCO bias current associated with the fourth plot 201d.

As shown in FIG. 8, $K_{VCO}$ of a VCO can increase with a decrease in VCO bias current.

Figure 9:
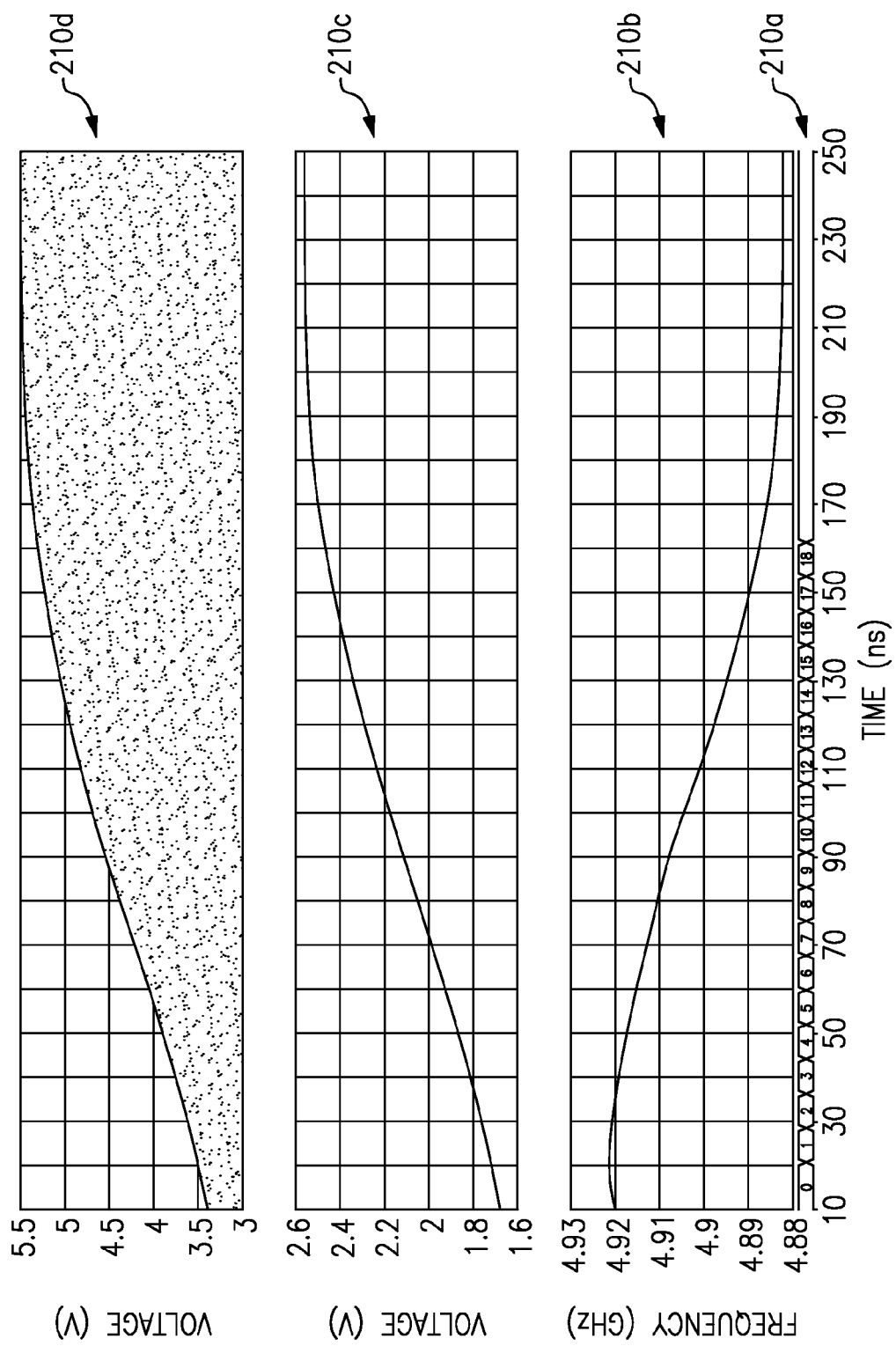
FIG. 9 shows graphs of one example of a transient simulation for a frequency tuning circuit and a VCO according to one embodiment.

FIG. 9 shows graphs of one example of a transient simulation for a frequency tuning circuit and a VCO according to one embodiment. FIG. 9 includes a first graph 210a of values of a bias DAC code used to control the VCO's bias current. As shown in the first graph 210a, the bias DAC code is incremented over time, and hence the VCO's bias current increases over time in this simulation. FIG. 9 further includes a second graph 210b of an output frequency of the VCO versus time. FIG. 9 further includes a third graph 210c of a VCO amplification circuit source node versus time. The illustrated simulation corresponds to an implementation of a VCO amplification circuit using field-effect transistors, and the third graph 210c illustrates a voltage level at the sources of a differential pair of the VCO amplification circuit. However, other configurations are possible. FIG. 9 further includes a fourth graph 210d of VCO amplitude versus time.

Figure 10:
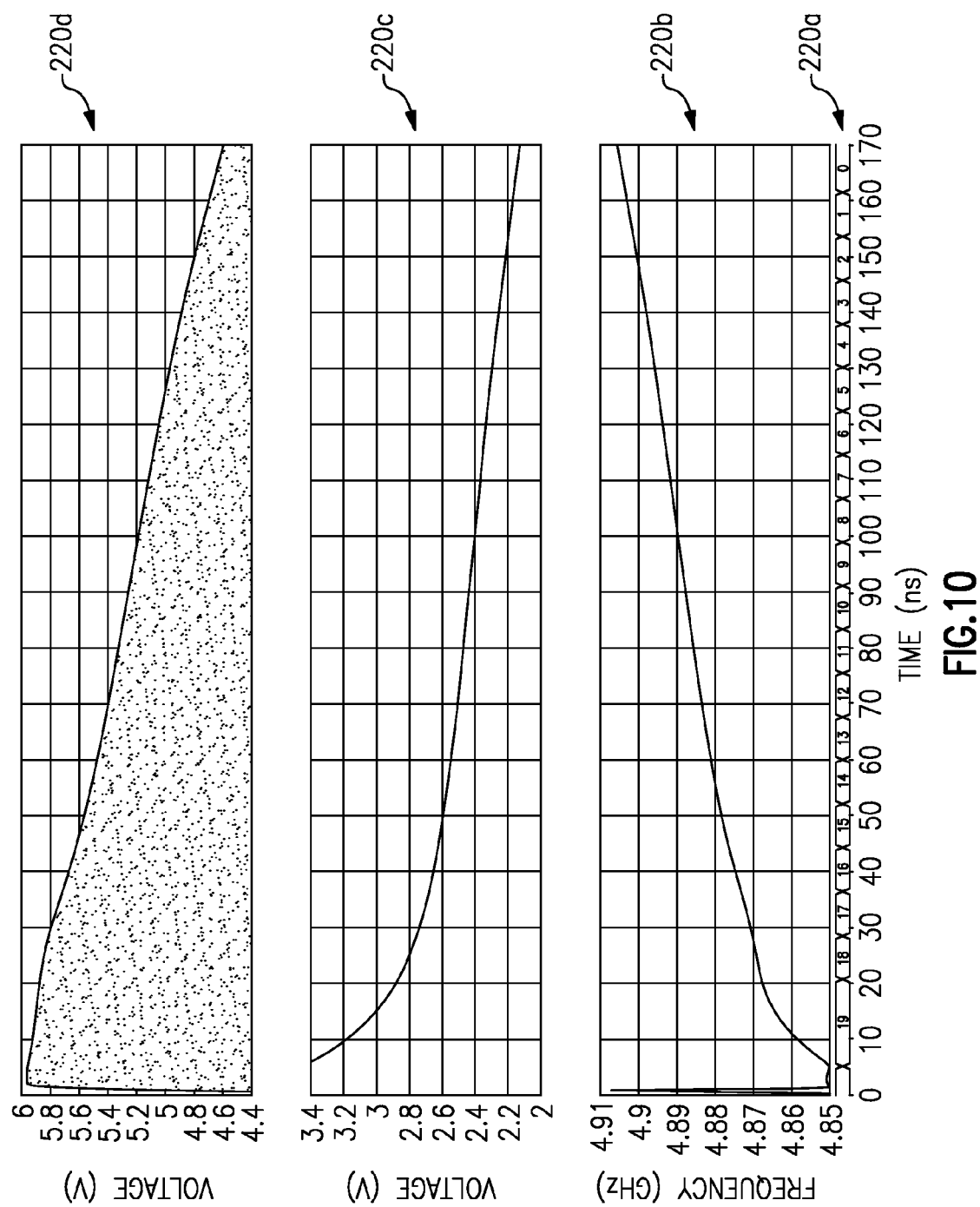
FIG. 10 shows graphs of another example of a transient simulation for a frequency tuning circuit and a VCO according to one embodiment.

FIG. 10 shows graphs of another example of a transient simulation for a frequency tuning circuit and a VCO according to one embodiment. FIG. 10 includes a first graph 220a of values of a bias DAC code used to control the VCO's bias current, a second graph 220b of an output frequency of the VCO versus time, a third graph 220c of a VCO amplification circuit source node versus time, and a fourth graph 220d of VCO amplitude versus time. The first to fourth graphs 220a-220d of FIG. 10 are similar to the first to fourth graphs 210a-210d of FIG. 9, respectively, except that FIG. 10 illustrates a transient simulation in which the bias DAC code is decremented over time.

As shown in FIGS. 9-10, linearly increasing the VCO bias DAC code can decrease the VCO's output frequency, and linearly decreasing the VCO bias DAC code can increase the VCO's output frequency. Additionally, increasing the VCO bias DAC code can increase VCO output amplitude, and decreasing the VCO bias DAC code can decrease VCO output amplitude.

As described earlier, in certain implementations, a digital state machine of a frequency tuning circuit can control a VCO's bias control signal to a setting associated with the VCO's amplitude being greater than a low amplitude threshold but smaller than a high amplitude threshold. Although the frequency tuning circuit can adjust a bias current of the VCO to maintain lock over temperature variation, the frequency tuning circuit can be configured to stop changing the bias control signal when an amplitude detection circuit determines that the VCO's amplitude has a value that is smaller than a low amplitude threshold and/or greater than a high amplitude threshold. Configuring the frequency tuning circuit in this manner can help prevent the frequency tuning circuit from adjusting the bias control signal in a manner that results in the VCO's amplitude being too small for oscillation at the operating temperature and/or too large to meet device breakdown or long-term reliability constraints.

In certain configurations, a VCO bias DAC can have a relatively small LSB, such that steps of the bias current are relatively small. Configuring a VCO bias DAC in this manner can avoid sudden changes in the VCO bias current and hence VCO output frequency. In addition, to protect the VCO output frequency from relatively large jumps or changes, a capacitor can be used at the output of the VCO bias DAC (for example, at a common source node of the VCO amplification circuit) to filter any glitches associated with VCO bias DAC code switching.

As shown in FIGS. 9-10, the transition in the VCO output frequency is relatively smooth. Accordingly, a PLL should maintain lock while the VCO's bias current is adjusted. In the illustrated configuration, controlling the VCO bias DAC provides another port for frequency tuning with around 25 MHz/V. However, other values are possible.

Figure 11:
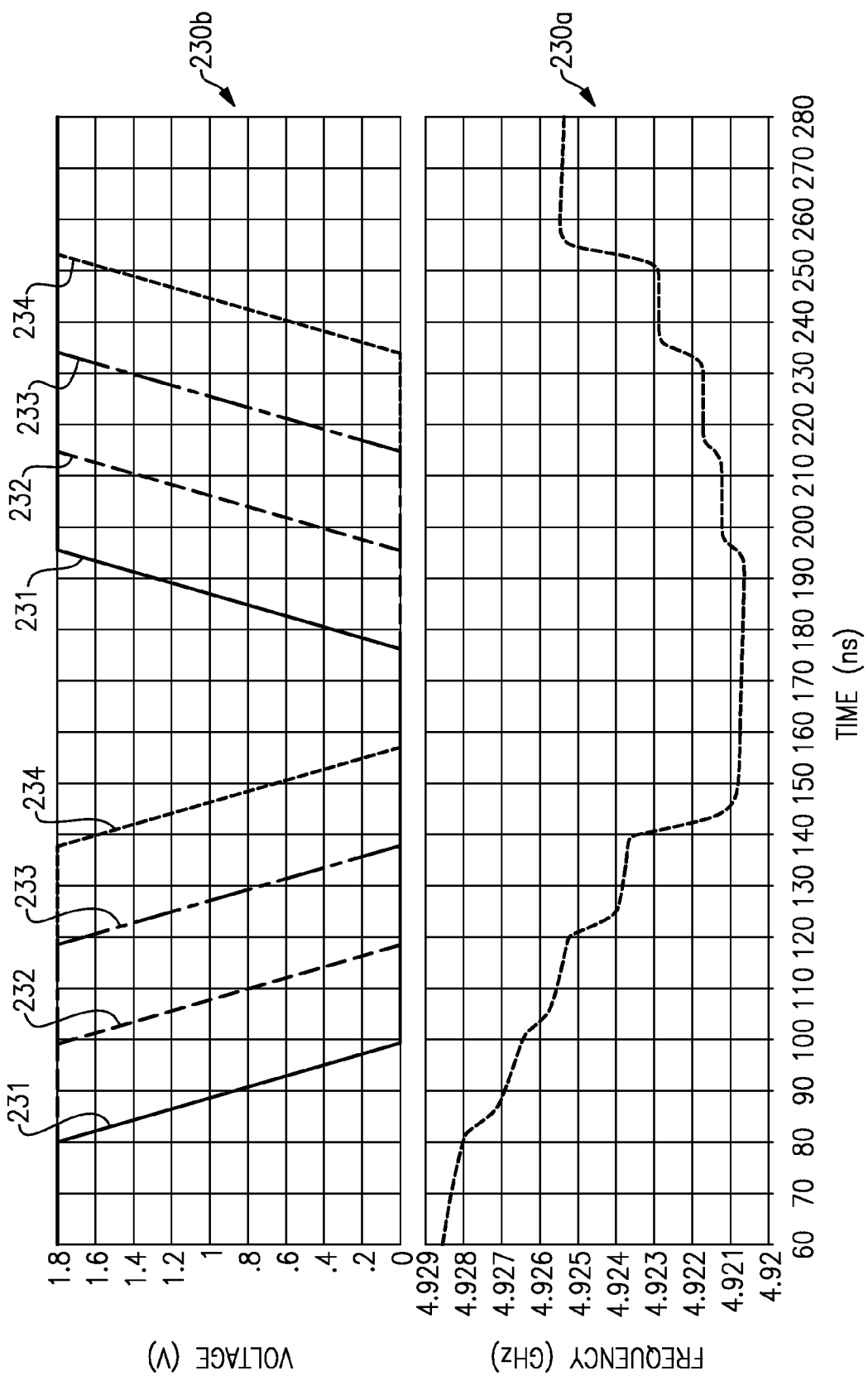
FIG. 11 shows graphs of one example of a transient simulation for a VCO according to one embodiment.

FIG. 11 shows graphs of one example of a transient simulation for a VCO according to one embodiment. FIG. 11 includes a first graph 230a of VCO frequency versus time, and a second graph 230b of the voltage level of control bits used to control a VCO's fine capacitance versus time. The figure graph 230b includes first to fourth plots 231-234 of first to fourth control bits, respectively. As shown in FIG. 11, changes in the control bits of the VCO's fine capacitor can result in changes in the VCO's output frequency. Since it can be difficult to filter an output of a VCO without impacting the VCO's operation, changes in a VCO's fine capacitance can cause relatively sudden VCO frequency changes. The frequency changes can be mitigated by configuring the VCO's fine capacitor to include a relatively small LSB.

Figure 12:
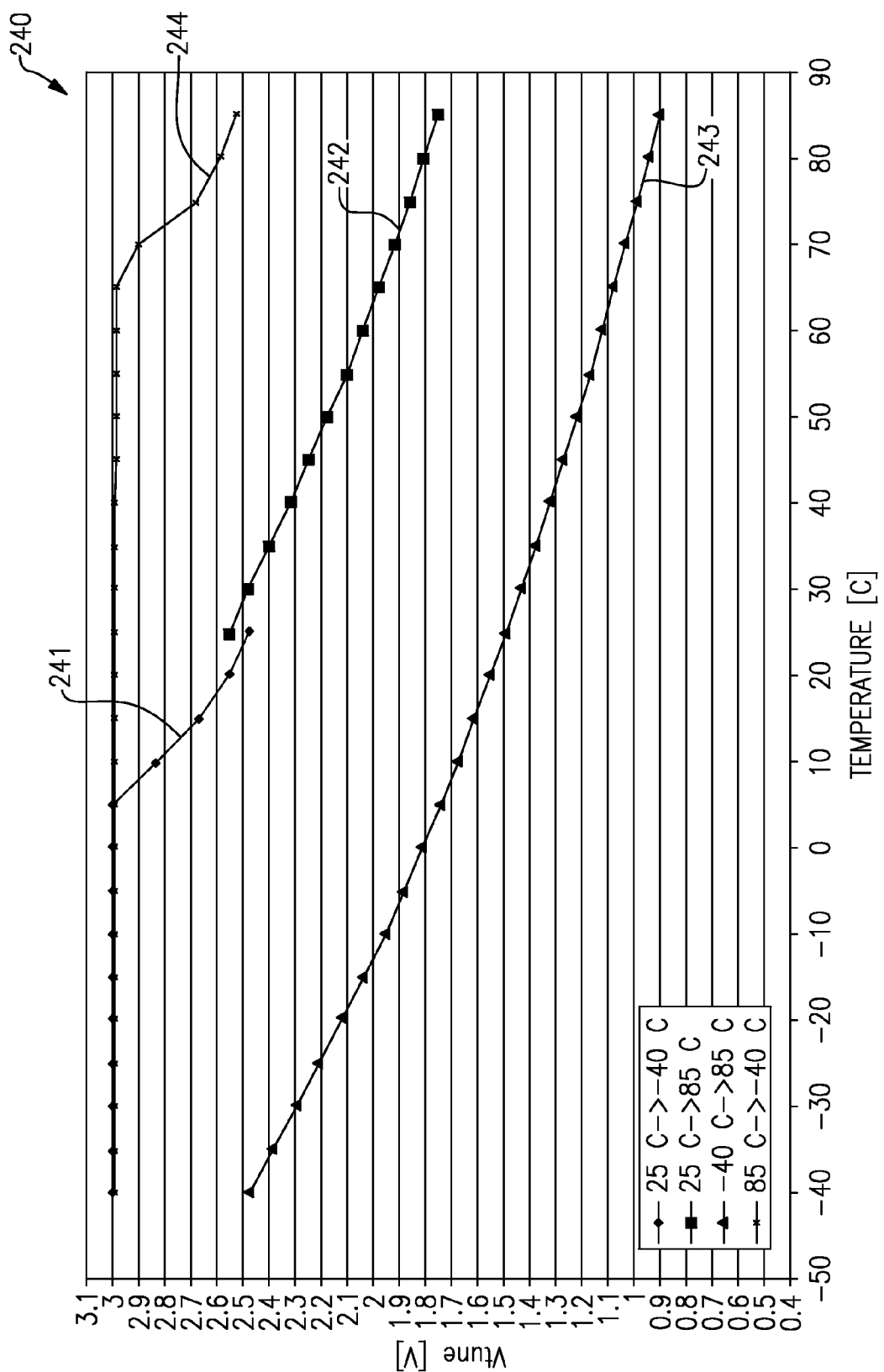
FIG. 12 shows a graph of tuning voltage versus temperature for a PLL calibrated with various calibration voltages according to one embodiment.

FIG. 12 shows a graph 240 of tuning voltage versus temperature for a PLL calibrated with various calibration voltages according to one embodiment. FIG. 12 includes a first plot 241 of a PLL calibrated at 25° C. without a temperature compensated calibration voltage, and a second plot 242 of a PLL calibrated at 25° C. without a temperature compensated calibration voltage. Although the tuning voltage can be mid-supply at 85° C., the tuning voltage can change with temperature variation. For example, as shown in the first plot 241, the tuning voltage can increase as temperature decreases. Furthermore, as shown in the first plot 241, the tuning voltage can reach a maximum tuning voltage with further temperature decreases, which can result in the PLL losing lock.

FIG. 12 further includes a third plot 243 of a PLL calibrated with a temperature compensated calibration voltage according to one embodiment. As shown in the third plot 243, the tuning voltage can remain above a minimum tuning voltage level and below a maximum tuning voltage level as the temperature change between −40° C. and 85° C. When the PLL is calibrated at a relatively low temperature, for example, −40° C., the calibration voltage can be relatively high, for instance, about 2.5 V in this example. However, when the PLL is calibrated at a relatively high temperature, for example, 85° C., the calibration voltage can be relatively low.

FIG. 12 further includes a fourth plot 244 of a PLL tuned with a 2.5 V calibration voltage at 85° C. As shown in FIG. 12, tuning the PLL with a 2.5 V calibration voltage at 85° C. can result in the PLL losing lock as the temperature decreases.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks, including, for example base stations. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled"

together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A phase-locked loop (PLL) comprising:
   a voltage controlled oscillator (VCO) having a tuning voltage input, wherein an oscillation frequency of the VCO changes in relation to the voltage level of the tuning voltage input according to a frequency control gain, wherein variations in the frequency control gain effect variations in a tuning voltage range of the VCO, and wherein the VCO is configured to generate an oscillation signal that oscillates at the oscillation frequency; and
   a frequency tuning circuit configured to set a frequency band setting of the VCO, the frequency tuning circuit comprising:
      a voltage monitor configured to compare the voltage level of the tuning voltage input to one or more tuning voltage threshold levels;
      a control circuit having a digital state machine, wherein the digital state machine is configured to control the frequency band setting and a bias current setting of the VCO; and
      an amplitude detection circuit configured to compare an amplitude of the oscillation signal to one or more amplitude threshold levels;
      wherein the digital state machine independently controls the bias current setting of the VCO to cause a change in the voltage level of the tuning voltage input; and
      wherein in response to determining the tuning voltage is not within the tuning voltage range the digital state machine either controls the bias current setting of the VCO or the frequency band setting of the VCO or a combination of the bias current setting and the frequency band setting of the VCO so as to effect a change in the voltage level of the tuning voltage input to bring the tuning voltage input within the tuning voltage range.

2. The PLL of claim 1, wherein the voltage monitor comprises a first comparator and a second comparator, wherein the first comparator is configured to compare the voltage level of the tuning voltage input to two or more low threshold voltage levels, and wherein the second comparator is configured to compare the voltage level of the tuning voltage input to two or more high threshold voltage levels.

3. The PLL of claim 1, the voltage monitor is configured to determine whether the voltage level of the tuning voltage input is within a tuning voltage range based on the comparison of the voltage level of the tuning voltage input to the one or more tuning voltage threshold levels.

4. The PLL of claim 3, wherein when the voltage monitor determines that the voltage level of the tuning voltage input is outside of the tuning voltage range, the control circuit adjusts an amount of bias current of the VCO.

5. The PLL of claim 4, wherein the control circuit is configured to adjust the amount of bias current of the VCO until the voltage monitor determines that the voltage level of the tuning voltage input is within the tuning voltage range.

6. The PLL of claim 1, wherein the amplitude detection circuit is configured to determine whether the amplitude of the oscillation signal is within an amplitude range based on the comparison of the amplitude of the oscillation signal to the one or more amplitude threshold levels.

7. The PLL of claim 6, wherein the amplitude detection circuit comprises an amplitude rectifier and at least one comparator.

8. The PLL of claim 6, wherein when the voltage monitor determines that the voltage level of the tuning voltage input is outside of the tuning voltage range, the control circuit is configured to adjust the amount of bias current of the VCO until the voltage monitor determines that the voltage level of the tuning voltage input is within the tuning voltage range or until the amplitude detection circuit determines that the amplitude of the oscillation signal is outside of the amplitude range.

9. The PLL of claim 8, wherein the control circuit is configured to adjust a fine capacitance of the VCO when both the voltage monitor determines that the voltage level of the tuning voltage input is outside of the tuning voltage range and the amplitude detection circuit determines that the amplitude of the oscillation signal is outside of the amplitude range.

10. An electronically-implemented method of maintaining lock in a phase-locked loop (PLL), the method comprising:
    receiving a tuning voltage from a loop filter at a tuning voltage input of a voltage controlled oscillator (VCO);
    determining whether a voltage level of the tuning voltage input is within a tuning voltage range;
    using a digital state machine to adjust an amount of bias current of the VCO or a frequency band setting of the VCO or a combination of an amount of bias current and a frequency band setting of the VCO so as to change the voltage level of the tuning voltage input when the voltage level of the tuning voltage input is outside of the tuning voltage range;
    determining whether an amplitude of an oscillation signal of the VCO is within an amplitude range; and
    adjusting a fine capacitance of the VCO when both the voltage level of the tuning voltage input is outside of the tuning voltage range and the amplitude of the oscillation signal is outside the amplitude range.

11. The method of claim 10, further comprising adjusting the amount of bias current of the VCO until the voltage level of the tuning voltage input is within the tuning voltage range.

12. The method of claim 10, further comprising:
    adjusting the amount of bias current of the VCO until the voltage level of the tuning voltage input is within the tuning voltage range or until the amplitude of the oscillation signal is outside of the amplitude range.

13. An apparatus comprising:
a phase-locked loop (PLL) having a calibration mode and an operational mode, the PLL comprising:
- a voltage controlled oscillator (VCO) having a tuning voltage input, wherein an oscillation frequency of the VCO changes in relation to a voltage level of the tuning voltage and wherein the VCO is configured to generate an oscillation signal that oscillates at the oscillation frequency; and
- a frequency tuning circuit configured to set a frequency band setting of the VCO, wherein the frequency tuning circuit comprises a voltage monitor configured to determine whether the voltage level of the tuning voltage input is within a tuning voltage range, an amplitude detection circuit configured to determine whether an amplitude of the oscillation signal is within an amplitude range, and a control circuit;
- wherein when the PLL is in the operational mode, the voltage monitor is configured to determine whether the voltage level of the tuning voltage input is within the tuning voltage range, and wherein when the voltage monitor determines that the voltage level of the tuning voltage input is outside of the tuning voltage range the control circuit adjusts an amount of bias current of the VCO;
- wherein the control circuit is configured to set the frequency band setting of the VCO by selecting a coarse capacitance setting of the VCO and to adjust the amount of bias current of the VCO until the voltage monitor determines that the voltage level of the tuning voltage input is within the tuning voltage range;
- wherein when the voltage monitor determines that the voltage level of the tuning voltage input is outside of the tuning voltage range, the control circuit is configured to adjust the amount of bias current of the VCO until the voltage monitor determines that the voltage level of the tuning voltage input is within the tuning voltage range or until the amplitude detection circuit determines that the amplitude of the oscillation signal is outside of the amplitude range; and
- wherein the control circuit is configured to adjust a fine capacitance of the VCO when both the voltage monitor determines that the voltage level of the tuning voltage input is outside of the tuning voltage range and the amplitude detection circuit determines that the amplitude of the oscillation signal is outside of the amplitude range.

14. The apparatus of claim 13, wherein the voltage monitor is configured to determine whether the voltage level of the tuning voltage input is within the tuning voltage range after the control circuit sets the frequency band setting of the VCO to a first setting and the PLL is locked.

15. The apparatus of claim 14, wherein when the voltage monitor determines that the voltage level of the tuning voltage input is outside of the tuning voltage range with the first setting, the control circuit is configured to adjust the coarse capacitance setting of the VCO until the voltage monitor determines that the voltage level of the tuning voltage input is within the tuning voltage range.

16. The apparatus of claim 13, wherein the tuning voltage range is programmable.

17. The apparatus of claim 13, wherein the control circuit comprises a state machine.

18. The apparatus of claim 13, wherein the voltage monitor comprises a first comparator and a second comparator, wherein the first comparator is configured to compare the voltage level of the tuning voltage input to two or more low threshold voltage levels, and wherein the second comparator is configured to compare the voltage level of the tuning voltage input to two or more high threshold voltage levels.

* * * * *